(12) United States Patent
Ahn et al.

(10) Patent No.: US 9,136,260 B2
(45) Date of Patent: *Sep. 15, 2015

(54) METHOD OF MANUFACTURING CHIP-STACKED SEMICONDUCTOR PACKAGE

(71) Applicant: Samsung Electronics Co., Ltd., Gyeonggi-do (KR)

(72) Inventors: Jung-seok Ahn, Seoul (KR); Dong-hyeon Jang, Gyeonggi-do (KR); Ho-geon Song, Gyeonggi-do (KR); Sung-jun Im, Gyeonggi-do (KR); Chang-seong Jeon, Gyeonggi-do (KR); Teak-hoon Lee, Gyeonggi-do (KR); Sang-sick Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/093,853

(22) Filed: Dec. 2, 2013

(65) Prior Publication Data

US 2014/0154839 A1 Jun. 5, 2014

Related U.S. Application Data

(63) Continuation of application No. 13/439,447, filed on Apr. 4, 2012, now Pat. No. 8,637,350.

(30) Foreign Application Priority Data

May 2, 2011 (KR) .................. 10-2011-0041543

(51) Int. Cl.
  *H01L 25/00* (2006.01)
  *H01L 23/48* (2006.01)
  (Continued)

(52) U.S. Cl.
  CPC .............. *H01L 25/50* (2013.01); *H01L 21/561* (2013.01); *H01L 21/6835* (2013.01); *H01L 21/76898* (2013.01); *H01L 23/481* (2013.01); *H01L 24/94* (2013.01); *H01L 24/97* (2013.01); *H01L 25/0657* (2013.01); *H01L 24/05* (2013.01); *H01L 24/06* (2013.01); *H01L 24/11* (2013.01); *H01L 24/13* (2013.01); *H01L 24/16* (2013.01); *H01L 24/17* (2013.01); *H01L 24/29* (2013.01);
  (Continued)

(58) Field of Classification Search
  CPC ..................... H01L 2224/81; H01L 21/76898; H01L 2225/06513; H01L 2225/06541; H01L 24/81; H01L 25/0657
  See application file for complete search history.

(56) References Cited

U.S. PATENT DOCUMENTS

| | | | |
|---|---|---|---|
| 8,883,566 B2* | 11/2014 | Morifuji et al. | 438/113 |
| 2008/0230912 A1* | 9/2008 | Lee et al. | 257/758 |

(Continued)

FOREIGN PATENT DOCUMENTS

KR   1020050021078   3/2005

*Primary Examiner* — Jaehwan Oh
(74) *Attorney, Agent, or Firm* — F. Chau & Associates, LLC

(57) ABSTRACT

A method of manufacturing a chip-stacked semiconductor package, the method including preparing a base wafer including a plurality of first chips each having a through-silicon via (TSV); bonding the base wafer including the plurality of first chips to a supporting carrier; preparing a plurality of second chips; forming stacked chips by bonding the plurality of second chips to the plurality of first chips; sealing the stacked chips with a sealing portion; and separating the stacked chips from each other.

20 Claims, 30 Drawing Sheets

(51) Int. Cl.
*H01L 21/56* (2006.01)
*H01L 23/00* (2006.01)
*H01L 25/065* (2006.01)
*H01L 21/768* (2006.01)
*H01L 21/683* (2006.01)
*H01L 25/18* (2006.01)

(52) U.S. Cl.
CPC ......... *H01L24/32* (2013.01); *H01L 24/73* (2013.01); *H01L 24/81* (2013.01); *H01L 24/83* (2013.01); *H01L 24/92* (2013.01); *H01L 25/18* (2013.01); *H01L 2221/68327* (2013.01); *H01L 2221/68381* (2013.01); *H01L 2224/0346* (2013.01); *H01L 2224/0401* (2013.01); *H01L 2224/05008* (2013.01); *H01L 2224/05009* (2013.01); *H01L 2224/0557* (2013.01); *H01L 2224/05568* (2013.01); *H01L 2224/05572* (2013.01); *H01L 2224/05624* (2013.01); *H01L 2224/05647* (2013.01); *H01L 2224/06181* (2013.01); *H01L 2224/11009* (2013.01); *H01L 2224/131* (2013.01); *H01L 2224/13124* (2013.01); *H01L 2224/13144* (2013.01); *H01L 2224/13147* (2013.01); *H01L 2224/16145* (2013.01); *H01L 2224/16225* (2013.01); *H01L 2224/17181* (2013.01); *H01L 2224/2929* (2013.01); *H01L 2224/29387* (2013.01); *H01L 2224/32145* (2013.01); *H01L 2224/32225* (2013.01); *H01L 2224/73204* (2013.01); *H01L 2224/81005* (2013.01); *H01L 2224/83191* (2013.01); *H01L 2224/83192* (2013.01); *H01L 2224/83851* (2013.01); *H01L 2224/92125* (2013.01); *H01L 2224/92143* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06544* (2013.01); *H01L 2225/06568* (2013.01); *H01L 2924/00014* (2013.01); *H01L 2924/01327* (2013.01); *H01L 2924/10253* (2013.01); *H01L 2924/14* (2013.01); *H01L 2924/15311* (2013.01); *H01L 2924/18161* (2013.01)

(56) References Cited

U.S. PATENT DOCUMENTS

| | | | |
|---|---|---|---|
| 2008/0303163 A1* | 12/2008 | Liu et al. | 257/772 |
| 2010/0144118 A1* | 6/2010 | Yang et al. | 438/459 |
| 2010/0159643 A1* | 6/2010 | Takahashi et al. | 438/108 |
| 2011/0183464 A1* | 7/2011 | Takahashi et al. | 438/108 |
| 2012/0238057 A1* | 9/2012 | Hu et al. | 438/107 |
| 2013/0026643 A1* | 1/2013 | England et al. | 257/774 |

* cited by examiner

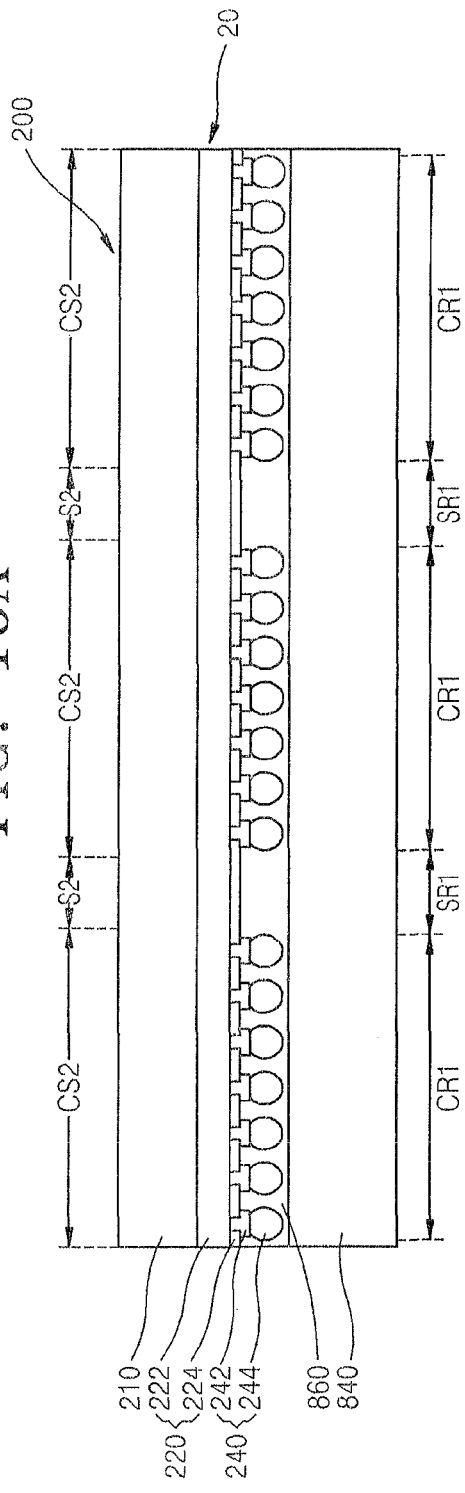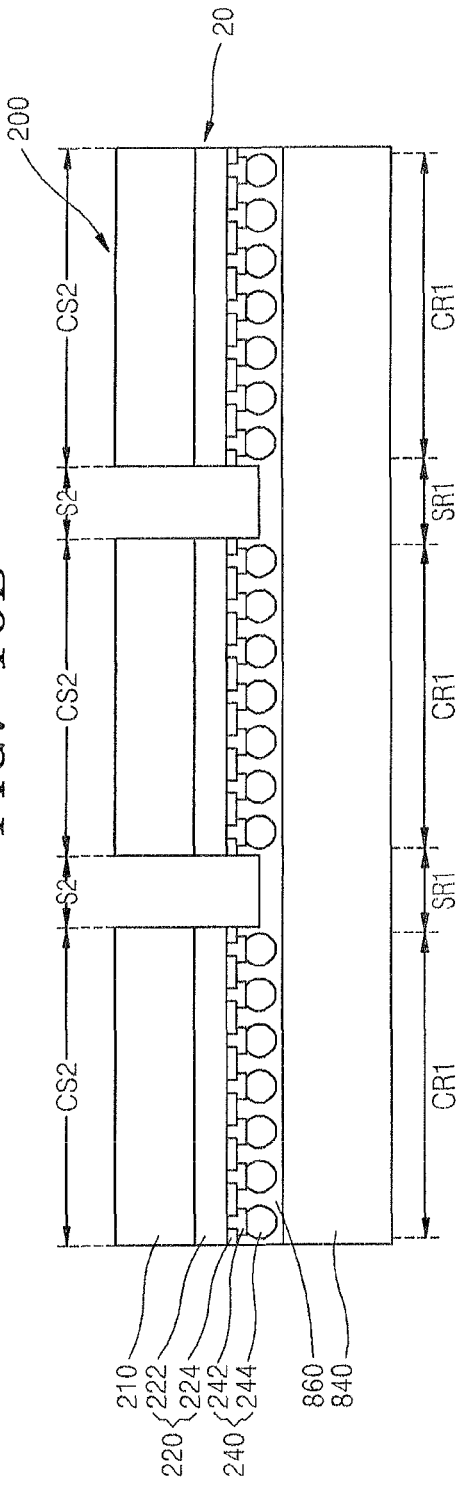

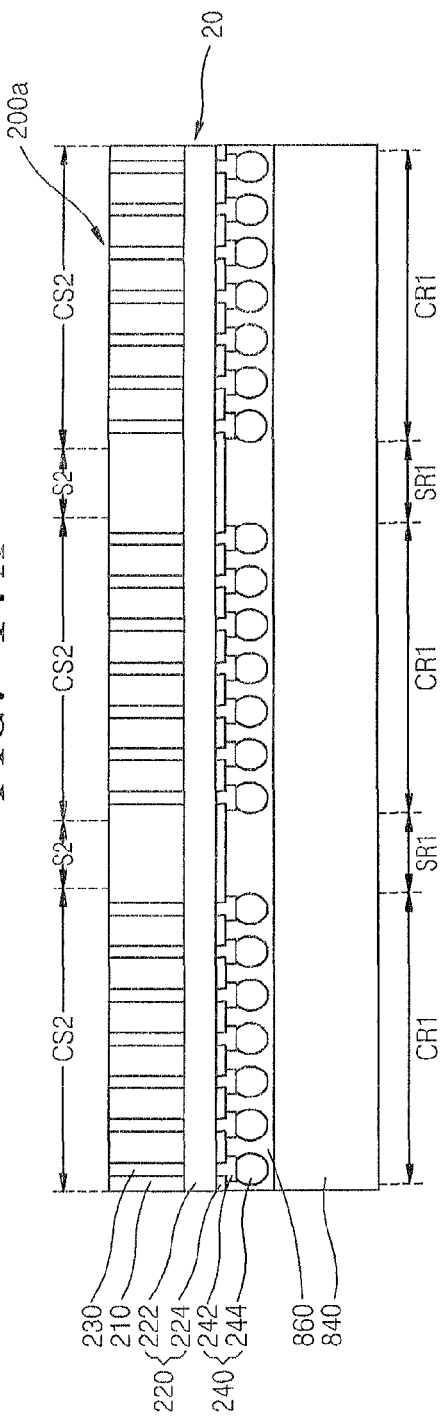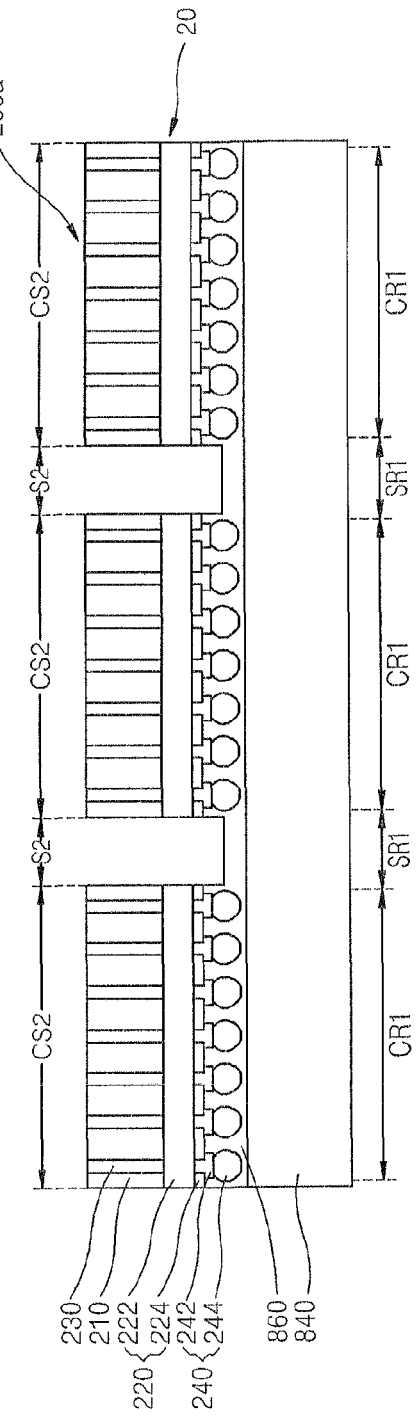

METHOD OF MANUFACTURING CHIP-STACKED SEMICONDUCTOR PACKAGE

CROSS-REFERENCE TO RELATED APPLICATIONS

This application is a continuation application of U.S. patent application Ser. No. 13/439,447 filed Apr. 4, 2012, which claims the benefit of Korean patent application serial number 10-2011-0041543, filed May 2, 2011, the entire disclosures of which are incorporated by reference herein in their entireties.

TECHNICAL FIELD

The inventive concept relates to a method of manufacturing a semiconductor package, and more particularly, to a method of manufacturing a chip-stacked semiconductor package in which a plurality of chips are stacked.

The semiconductor industry pursues manufacturing small-sized, multifunctional, and high-capacity semiconductor products having high reliability at a low cost. Semiconductor packaging technology is an important technology enabling achievement of such complex goals. A semiconductor packaging technology is herein provided for achieving the complex goals stated above. The technology provides a semiconductor package in which a plurality of chips are stacked.

SUMMARY

The inventive concept provides a method of manufacturing a chip-stacked semiconductor package that is small in size, has high functionality, and high capacity due to the stacking of a plurality of chips.

In an embodiment of the inventive concept, a method of manufacturing a chip-stacked semiconductor package is provided, the method includes preparing or providing a base wafer including a plurality of first chips each having a through-silicon via (TSV); bonding the base wafer including the plurality of first chips to a supporting carrier; preparing or providing a plurality of second chips; forming stacked chips by bonding the plurality of second chips to the plurality of first chips; sealing the stacked chips with a sealing portion; and separating the stacked chips from each other.

In an embodiment, of the inventive concept, the preparation of the base wafer may include forming an integrated circuit layer on a first surface of a semiconductor substrate having a first surface and a second surface; forming an interlayer insulation layer covering the integrated circuit layer on the first surface; forming the TSV extending in the semiconductor substrate through the interlayer insulation layer; forming an inter-metallic insulation layer including a multilayer interconnection pattern connected to the TSV on the interlayer insulation layer; forming a first connection unit electrically connected to the multilayer interconnection pattern on the inter-metallic insulation layer; exposing the TSV to the second surface; and forming a protection layer and a conductive pad connected to the TSV on the second surface, wherein, in the bonding of the base wafer, the first connection unit of the first chip may face the supporting carrier.

In an embodiment, the preparation of the base wafer may further include bonding a non-conductive film (NCF) or an anisotropic conductive film (ACF) to the protection layer and the conductive pad, after forming the conductive pad, and the forming of the stacked chips may include bonding the plurality of second chips to the plurality of first chips through the NCF or the ACF.

In an embodiment, the plurality of second chips may be of the same kind of chips as the plurality of first chips.

In an embodiment, each of the plurality of second chips may include a second connection unit electrically connected to an integrated circuit layer thereof, wherein, in the forming of the stacked chips, the second connection unit may be electrically connected to the TSV.

In an embodiment, the method may further include, before the sealing of the stacked chips, filling a connection portion between the first chips and the second chips with an underfill.

In an embodiment, the plurality of second chips may be bonded to the plurality of first chips, at least two second chips are stacked on one first chip so that stacked chips comprise at least three chips.

In an embodiment, the method may further include, before the separating of the stacked chips, exposing upper surfaces of the second chips by grinding an upper portion of the sealing portion.

In an embodiment, the method may further include: after the exposing of the upper surfaces of the second chips, removing the supporting carrier; bonding a supporting substrate to the upper portion of the sealing portion; and performing an electrical die sort (EDS) test for the stacked chips.

In an embodiment, the method may further include: after the separating of the stacked chips, removing the supporting substrate; and mounting a separated stacked chip on a main chip. A second TSV and a third connection unit connected to the second TSV may be formed in the main chip, and the main chip may be mounted on a board substrate through the third connection unit.

In an embodiment, of the inventive concept, there is provided a method of manufacturing a chip-stacked semiconductor package, the method includes: preparing a base wafer including a plurality of first chips each having a first size and a through-silicon via (TSV); bonding the base wafer to a supporting carrier; preparing a plurality of second chips each having a second size that is smaller than the first size; forming stacked chips by bonding the plurality of second chips to the plurality of first chips; sealing the stacked chips with a sealing portion; and separating the stacked chips from each other by sawing the base wafer and the sealing portion.

In an embodiment, the sealing portion may be formed to cover a connection portion between the first chips and the second chips and sides of the second chips.

In an embodiment, the base wafer and the sealing portion may be sawed based on a size of the first chips and a sealing portion of sides of the second chips may be exposed.

In an embodiment, the base wafer and the sealing portion may be sawed based on a size of the second chips and sides of the first and second chips may be exposed.

BRIEF DESCRIPTION OF THE DRAWINGS

Exemplary embodiments of the inventive concept will be more clearly understood from the following detailed description taken in conjunction with the accompanying drawings in which:

FIGS. 16A and 16B are cross-sectional views illustrating a method of manufacturing a second chip used in a method of manufacturing a chip-stacked semiconductor package, according to an embodiment of the inventive concept;

FIGS. 17A and 17B are cross-sectional views illustrating a method of manufacturing a second chip used in a method of manufacturing a chip-stacked semiconductor package, according to an embodiment of the inventive concept;

DETAILED DESCRIPTION OF THE EMBODIMENTS

Figure 1:
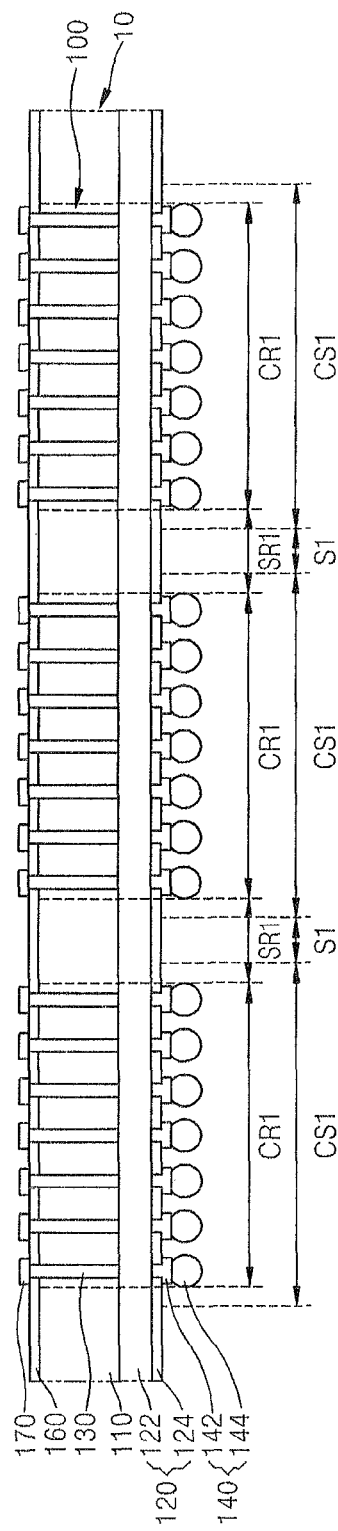
FIGS. 1 through 11 are cross-sectional views illustrating a method of manufacturing a chip-stacked semiconductor package according to an embodiment of the inventive concept.

Reference will now be made in detail to exemplary embodiments, examples of which are illustrated in the accompanying drawings. However, the ineventive concept is not limited to the embodiments illustrated hereinafter, on the contrary, the embodiments herein are introduced to provide easy and complete understanding of the scope and spirit of exemplary embodiments. In the drawings, thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both orientations of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of exemplary embodiments. As used herein, the singular forms "a", "an", and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 through 11 are cross-sectional views illustrating a method of manufacturing a chip-stacked semiconductor package according to an embodiment of the inventive concept.

Referring to FIG. 1, a base wafer 10, including a plurality of chips, namely, first chips 100, each in which at least one through-silicon via (TSV) 130 is formed, is prepared. In the base wafer 10, the plurality of first chips 100, including the TSV 130, are simultaneously formed at a wafer level.

In the base wafer 10, a size of a chip region is indicated as "CR1". The size CR1 of a chip region may be defined by a CR1-width and a CR1-length. The width of a scribe line region between the first chips 100 is indicated as "SR1". The scribe line region may be oriented along a width or a length of the chip region CR1.

The first chips 100 are next separated by a sawing process and are labeled as "CS1" in FIG. 1. The lines CS1 of the first chips 100 may be along a width or a length of CR1. The width of the region sawed by a blade in the scribe line region in the sawing process is illustrated as "S1". The size S1 of a region sawed by the blade may be along a width or a length of CR1. The size S1 of a region sawed by the blade may be a width of the blade. Although, in FIG. 1, three first chips 100 are illustrated in the base wafer 10 for convenience of description, dozens or even hundreds of chips may be formed in the base wafer 10.

The base wafer 10 may include a body layer 110, a lower insulation layer 120, the TSV 130, a first connection unit 140, a protection layer 160, and an upper pad 170. The body layer 110 may include a silicon substrate (not shown), an integrated circuit layer formed on the silicon substrate, and an interlayer insulation layer (not shown) covering the integrated circuit layer. The lower insulation layer 120 is formed under the body layer 110 and may include an inter-metallic insulation layer 122 and a passivation layer 124. A multi-level interconnection pattern (not shown) may be formed inside the inter-metallic insulation layer 122.

The TSV 130 may be connected to the multi-level interconnection pattern of the lower insulation layer 120 through the body layer 110. The first connection unit 140 may include a bump pad 142 and a bump 144. The bump pad 142 may be formed on the passivation layer 124 with conductive material, and may be electrically connected to the multi-level interconnection pattern of the lower insulation layer 120. Accordingly, the bump pad 142 may be electrically connected to the TSV 130 through the multi-level interconnection pattern of the lower insulation layer 120.

An under bump metal (UBM) (not shown) may be formed on the bump pad 142. The bump pad 142 may be formed of a conductive material such as aluminum (Al), copper (Cu), or the like, and may be formed using a pulse plating method or a direct current plating method. However, the formation of the bump pad 142 is not limited to these pulse plating or direct current plating methods.

In an embodiment, the bump 144 may be formed on the bump pad 142. The bump 144 may be formed with a conductive material, for example, copper (Cu), aluminum (Al), gold (Au), solder, or the like. However, the composition of the bump 144 is not limited thereto. If the bump 144 is formed of solder, the bump 144 is called a solder bump. The protection layer 160 is formed on the upper surface of the body layer 110. The protection layer 160 may be formed of insulating material, and thus, may protect the body layer 110 from the outside. The protection layer 160 may be formed of an oxide film, a nitride film, or a dual-layer film including the oxide film and the nitride film. For instance, the protection layer 160 may be formed of a silicon oxide ($SiO_2$) film, by using a high density plasma-chemical vapor deposition (HDP-CVD) process.

In an embodiment, the upper pad 170 is formed on the protection layer 160 and may be connected to the TSV 130. The upper pad 170 may be formed of aluminum, copper, or the like, similar to the bump pad 142. The base wafer 10 is described in more detail below.

Figure 2:
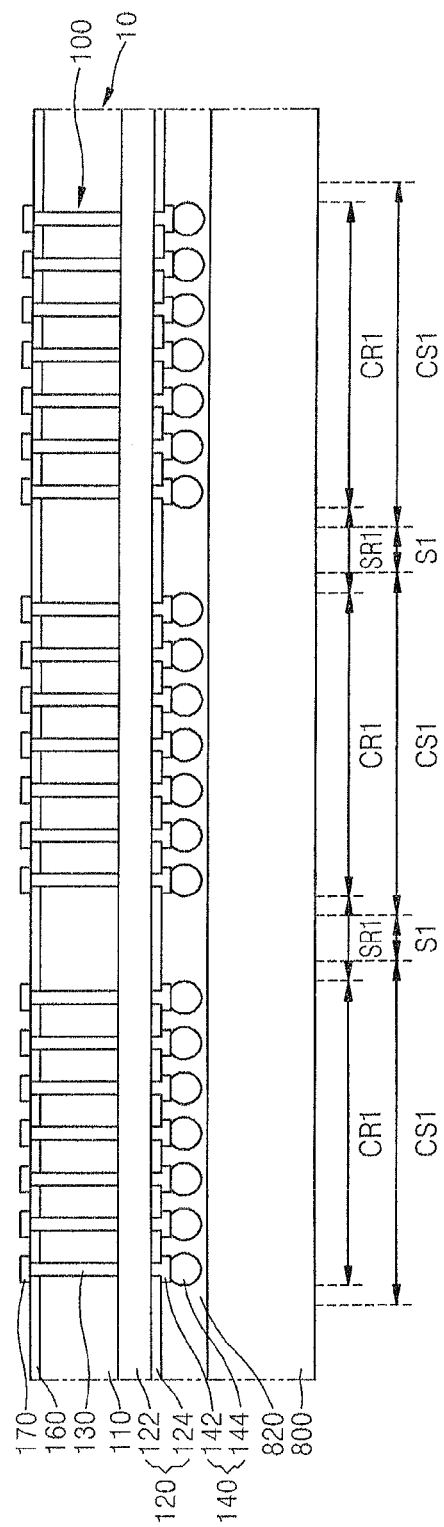

Referring to FIG. 2, in an embodiment, a supporting carrier 800 is prepared. An adhesive layer 820 may be formed on the supporting carrier 800. The supporting carrier 800 may be formed as a substrate that includes silicon, germanium, silicon-germanium, gallium-arsenic (GaAs), glass, plastic, ceramic, or the like. In an embodiment, the supporting carrier 800 may be formed as a silicon substrate or a glass substrate. The adhesive layer 820 may be formed as a non-conductive film (NCF), an anisotropic conductive film (ACF), an ultraviolet (UV) film, an instant adhesive, a thermosetting adhesive, a laser-setting adhesive, an ultrasonic-setting adhesive, a non-conductive paste (NCP), or the like.

The base wafer 10 is bonded to the supporting carrier 800 using the adhesive layer 820. The base wafer 10 may be bonded to the supporting carrier 800 such that the first connection unit 140 faces the supporting carrier 800. Before preparing the base wafer 10 or after preparing the base wafer 10, the supporting carrier 800 may be prepared before bonding the base wafer 10 to the supporting carrier 800.

Figure 3:
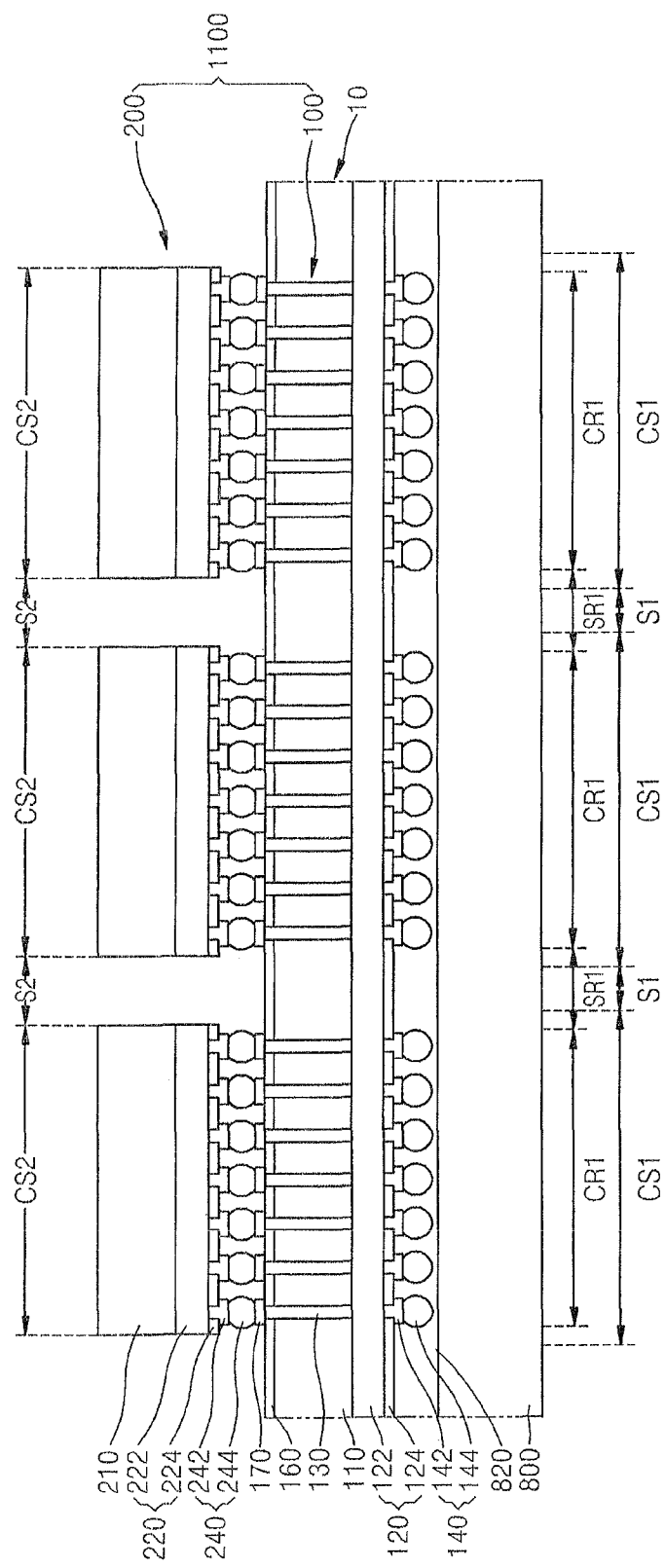

Referring to FIG. 3, in an embodiment, a second chip 200 is prepared. The second chip 200 may include a body layer 210, a lower insulation layer 220, and a second connection unit 240. Similar to the body layer 110, the body layer 210 may include a silicon substrate (not shown), an integrated circuit layer formed on the silicon substrate, and an interlayer insulation layer (not shown) covering the integrated circuit layer. The upper surface of the body layer 210 may be exposed to the outside. The upper surface of the body layer 210 may be a second surface of the silicon substrate opposite to a first surface of the silicon substrate on which the integrated circuit layer is formed. Accordingly, silicon of the silicon substrate may be exposed to the outside. If desired, a protection layer, as in the first chips 100, may be formed on the second surface of the silicon substrate.

The lower insulation layer 220 is formed under the body layer 210 and may include an inter-metallic insulation layer 222 and a passivation layer 224. A multi-level interconnection pattern (not shown) may be formed inside the inter-metallic insulation layer 222.

The second connection unit 240 may include a bump pad 242 and a bump 244. The bump pad 242 may be formed with conductive material on the passivation layer 224, and may be electrically connected to the multi-level interconnection pattern of the lower insulation layer 220. An under bump metal (UBM) (not shown) may be formed on the bump pad 242. The bump pad 242 may be formed with the same material as or different material from that of the bump pad 142 of the first connection unit 140, and may be formed by the same method as or a different method from that of forming the bump pad 142 of the first connection unit 140.

The bump 244 may be formed on the bump pad 242. The bump 244 is formed of conductive material, and may be formed of copper (Cu), aluminum (Al), gold (Au), solder, or the like, similar to the bump 144 of the first connection unit 140. However, the composition of bump 244 is not limited thereto. In the second chip 200, in contrast to the first chips 100, a TSV that penetrates the body layer 210 may not be formed. Accordingly, an upper pad also may not be formed.

A stacked chip 1100 is formed by stacking the second chip 200 on each of the upper surfaces of the first chips 100. A stack may be formed by bonding the second connection unit 240 of the second chip 200 to the upper pad 170 of the first chip 100 by using a thermal pressing method. The second connection unit 240 of the second chip 200 may be connected to the upper pad 170 of the first chip 100. Accordingly, the multi-level interconnection pattern of the second chip 200 may be electrically connected to the TSV 130 of the first chip 100 through the second connection unit 240 of the second chip 200.

If a position of the second connection unit 240 of the second chip 200 corresponds to a position of the upper pad 170 of the first chip 100, the second chip 200 may be stacked on the first chip 100. The second chip 200 may be a different kind of chip from the first chip 100. Alternatively, the second chip 200 may be the same kind of chip as the first chip 100.

The second chip 200 may be obtained by sawing the same base wafer 10 illustrated in FIG. 1, wherein a TSV may not be formed in the second chip 200. However, in contrast to the embodiment shown in FIG. 3, a TSV may be formed in the second chip 200. The second chip 200 may be a chip obtained by separating it from the same base wafer 10 that originally included the first chip 100.

The size of the second chip 200 is indicated as "CS2". The size CS2 of the second chip 200 may be defined by a CS2 width or a CS2 length. The size CS2 of the second chip 200 is smaller than the size CS1 of the first chip 100. "S2" indicates a size of a region sawed by a blade inside a scribe line region of a wafer (not shown) for the second chip 200. The size S2 may be along a width or a length of CS2 and is wider than the size S1. The size S2 may be a width of the blade. Because the size CS2 of the second chip 200 is smaller than the size CS1 of the first chip 100 and the size S2 of a region sawed by the blade is larger than the size S1, the underfill process (described below) and the sawing process may be easily performed.

Figure 4:
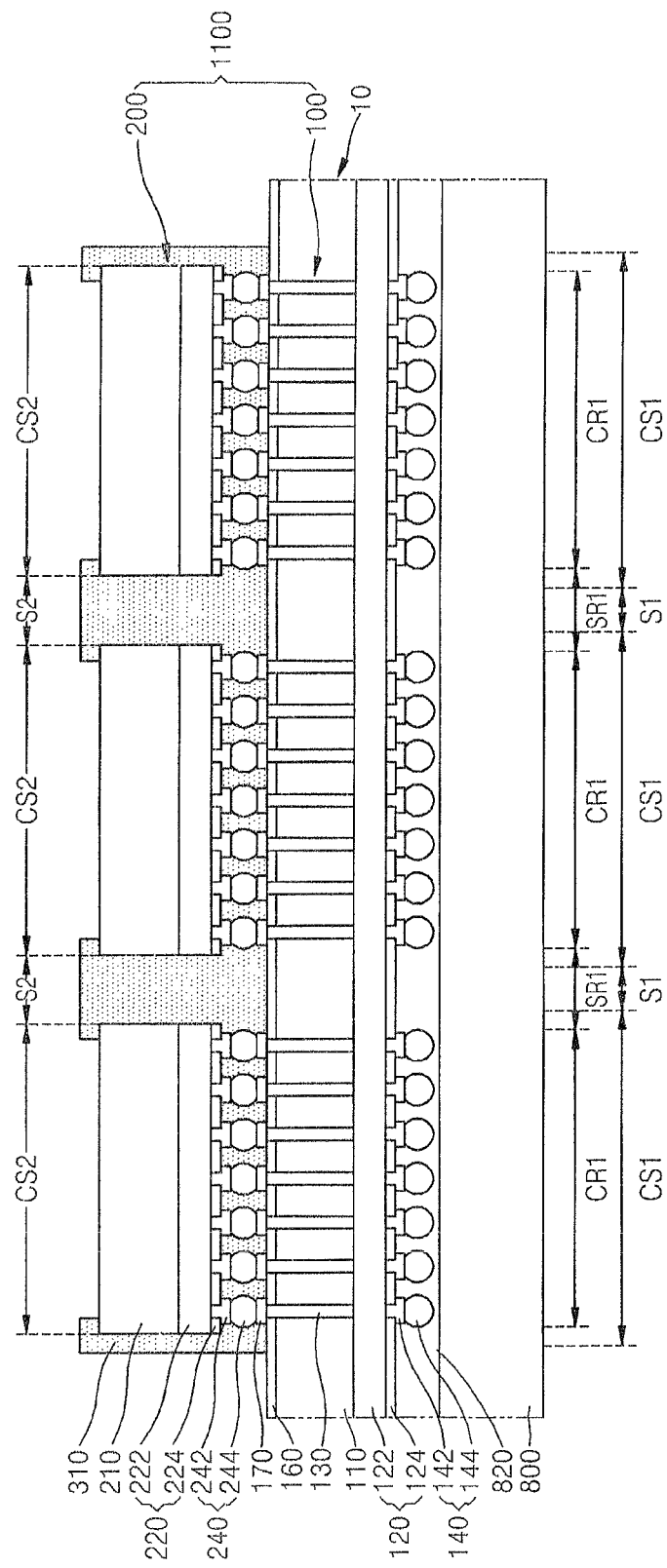

Referring to FIG. 4, an underfill 310 for filling a connecting portion between the first chip 100 and the second chip 200 of the stacked chip 1100 is formed. As stated above, by making the size CS2 of the second chip 200 stacked on the first chip 100 smaller than the size CS1 of the first chip 100, the underfill process may be easily performed even though the size, for example, the width, of the scribe line region is narrow in a highly integrated wafer. The underfill 310 may fill the connecting portion between the first chip 100 and the second chip 200, i.e., a portion in which the upper pad 170 of the first chip 100 and the second connection unit 240 are connected to each other. The underfill 310 may be formed with underfill resin such as epoxy resin, and may include a silica filler, a flux, or the like. The underfill 310 may be formed of different material from that of a molding layer which is formed as described below. However, in an embodiment, the underfill 310 may be formed of the same material as that of the molding layer.

As illustrated in FIG. 4, the underfill 310 may seal not only the connecting portion between the first chip 100 and the second chip 200 but also the sides of the second chip 200 and a portion of the upper surface of the second chip 200, which extend from the connecting portion. That is, the underfill 310 may fill the connecting portion between the first chip 100 and the second chip 200, but, as illustrated in FIG. 4, the underfill 310 may be formed so as to cover the sides of the second chip 200. The underfill 310 may overlap with an adjacent underfill. In this manner, if the underfill 310 covers the sides of the second chip 200, the sides of the underfill 310 may be exposed after a semiconductor package is completed. In the case of using a MUF (molded underfill) process, the underfill process in this step may be omitted.

Figure 5:
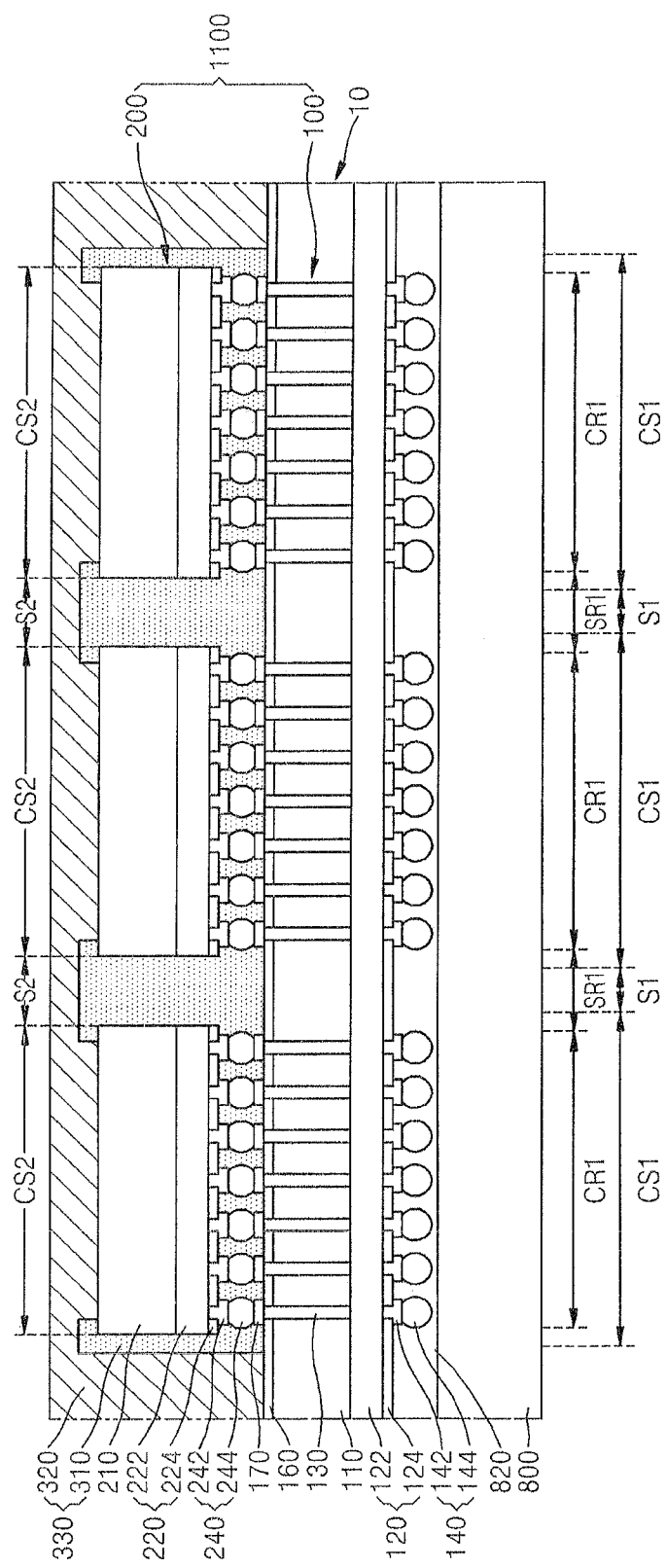

Referring to FIG. 5, a molding layer 320 is formed to mold the stacked chip 1100 bonded to the supporting carrier 800. The molding layer 320 may be formed of polymer such as a resin. For example, the molding layer 320 may be formed of an epoxy molding compound (EMC). Accordingly, a sealing portion 330, including the underfill 310 and the molding layer 320, is formed on the stacked chip 1100. The sealing portion 330 may seal the sides and the upper surfaces of the first and second chips 100 and 200 of the stacked chip 1100. The molding layer 320 may seal the side and the upper surface of the underfill 310.

Figure 6:
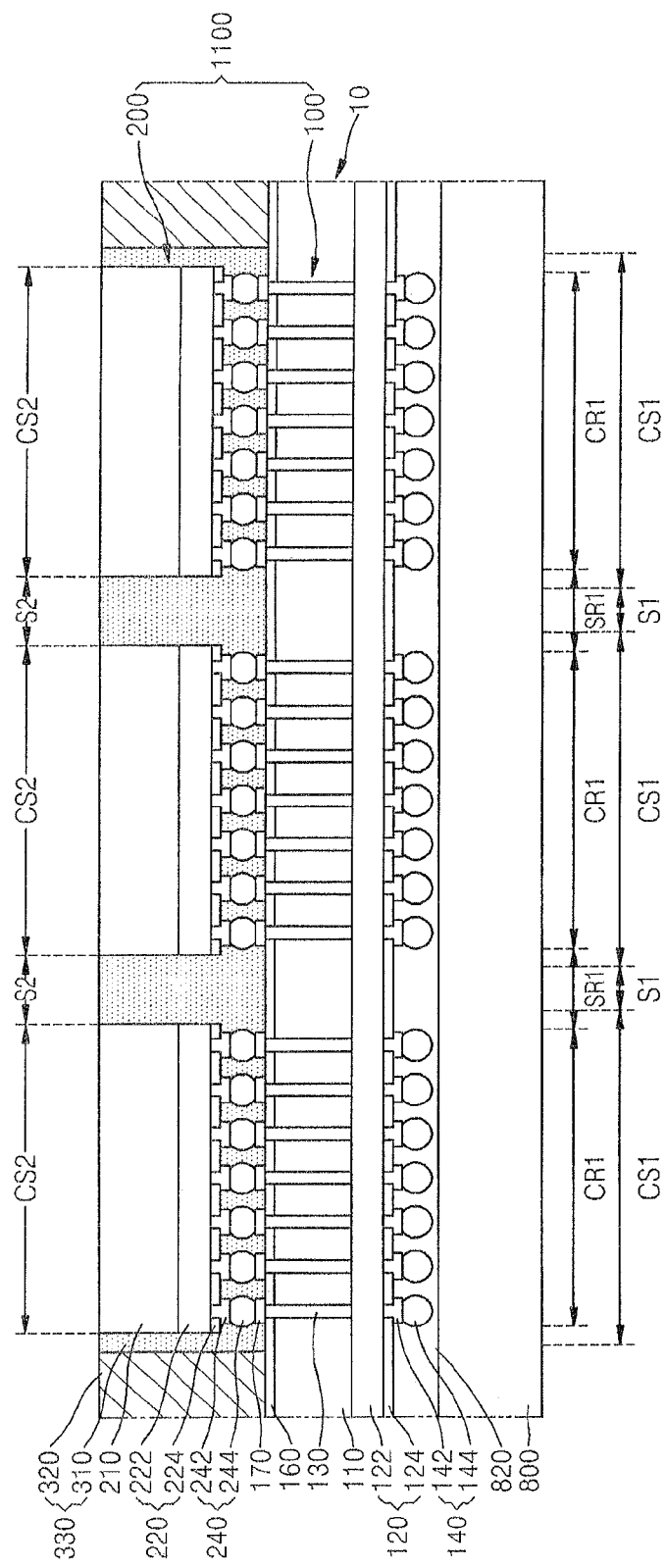

Referring to FIG. 6, the upper side of the second chip 200 of the stacked chip 1100 may be exposed by grinding the upper surface of the sealing portion 330. The upper surface of the sealing portion 330 may be leveled with the horizontal plane as that of the second chip 200. In the case where the TSV is not formed in the second chip 200, the upper surface of the second chip 200 may be the second surface, on which the integrated circuit layer is not formed, of a semiconductor substrate, i.e., the silicon substrate, and thus, the silicon of the second surface of the semiconductor substrate may be exposed to the outside.

In the case where the upper surface of the second chip 200 of the stacked chip 1100 is exposed by grinding the upper surface of the sealing portion 330, when the chip-stacked semiconductor package, which is completed hereafter, is mounted on a board substrate and then molded, an additional molding layer may be connected and bonded to the upper side of the second chip 200.

Figure 7:
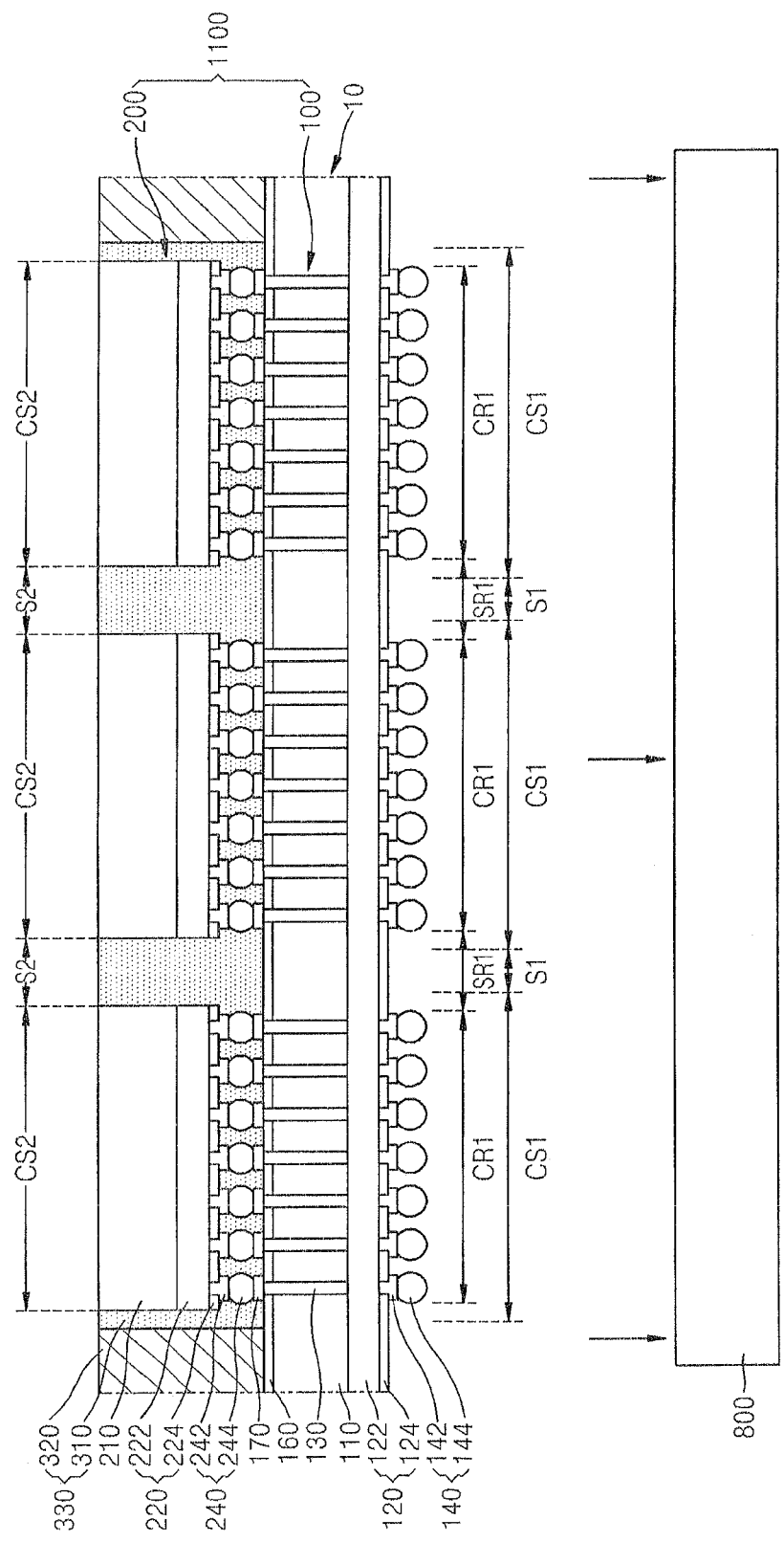

Referring to FIG. 7, the first connection unit 140 of the first chip 100 of the stacked chip 1100 may be exposed to the outside by separating the supporting carrier 800 from the base wafer 10 and removing the adhesive layer 820 from the base wafer 110.

In an embodiment of the present inventive concept, the supporting carrier 800 and the adhesive layer 820 may be removed separately, and, in some cases, the supporting carrier 800 and the adhesive layer 820 may be removed simultaneously. For example, when the supporting carrier 800 is formed with a transparent material, for example, a glass substrate, and the adhesive layer 820 is formed as a UV film, the supporting carrier 800 and the adhesive layer 820 may be separated simultaneously from the base wafer 10 by UV irradiation.

Figure 8:
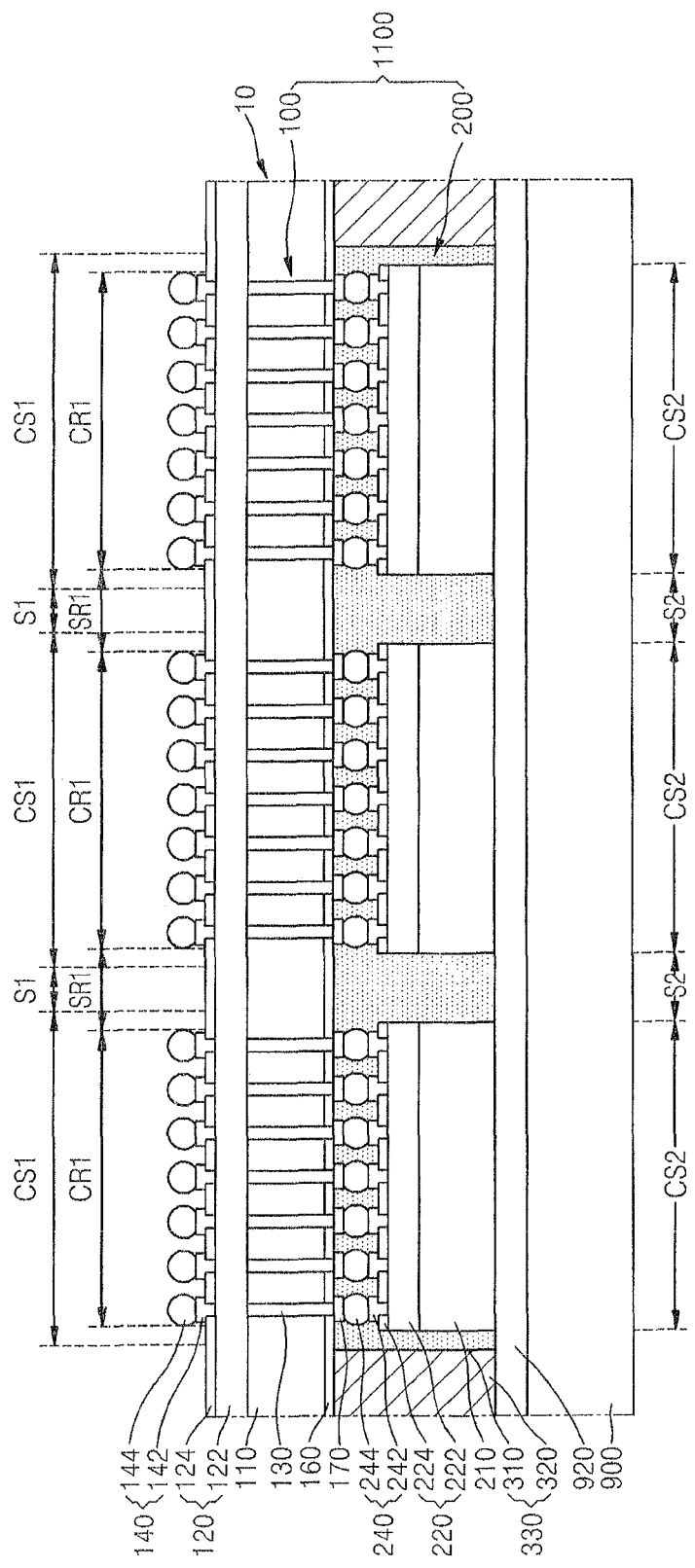

Referring to FIG. 8, after inverting the base wafer 10 to which the stacked chip 1100 is bonded, a supporting substrate 900 is bonded thereto. Using an adhesive layer 920, the supporting substrate 900 is bonded to the second surface opposite to the first surface on which the first connection unit 140 of the first chip 100 is exposed. The supporting substrate 900 may be formed of silicon, germanium, silicon-germanium, gallium-arsenic (GaAs), glass, plastic, ceramic, or the like. The adhesive layer 920 may be formed as an NCF, an ACF, a UV film, an instant adhesive, a thermosetting adhesive, a laser-setting adhesive, an ultrasonic-setting adhesive, an NCP, or the like. In an embodiment, the supporting substrate 900 may be formed as a glass substrate, and the adhesive layer 920 may be formed as a UV film.

Figure 9:
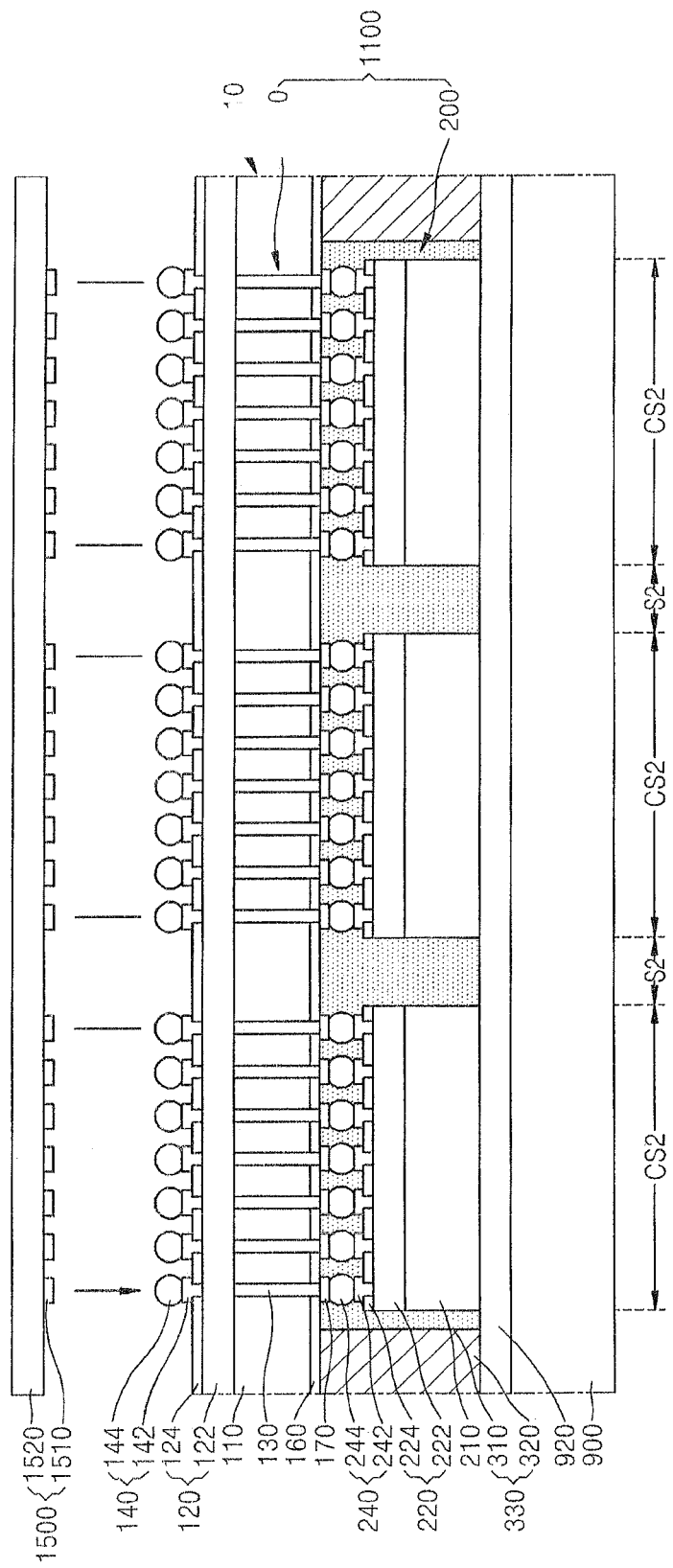

Referring to FIG. 9, an electrical die sorting (EDS) test for the stacked chip 1100 is performed by using the supporting substrate 900. The EDS test may be performed by using a probe card 1500 or the like. The probe card 1500 may include a body portion 1520 and terminal pins 1510. The terminal pins 1510, for example, may be pogo pins. The pogo pins contact a corresponding first connection unit 140, and an electrical signal is applied to pogo pins, and thus, the EDS test may be performed.

It may be determined whether the stacked chip 1100 is good or defective through the EDS test. If it is determined that the stacked chip 1100 is defective through the EDS test, the defective stacked chip 1100 is scrapped. The chip-stacked semiconductor package according to the current embodiment is a package in which chips passing the EDS test are stacked. Accordingly, the chip-stacked semiconductor package according to the current embodiment may be called a known good die stack (KGDS) package.

Figure 10:
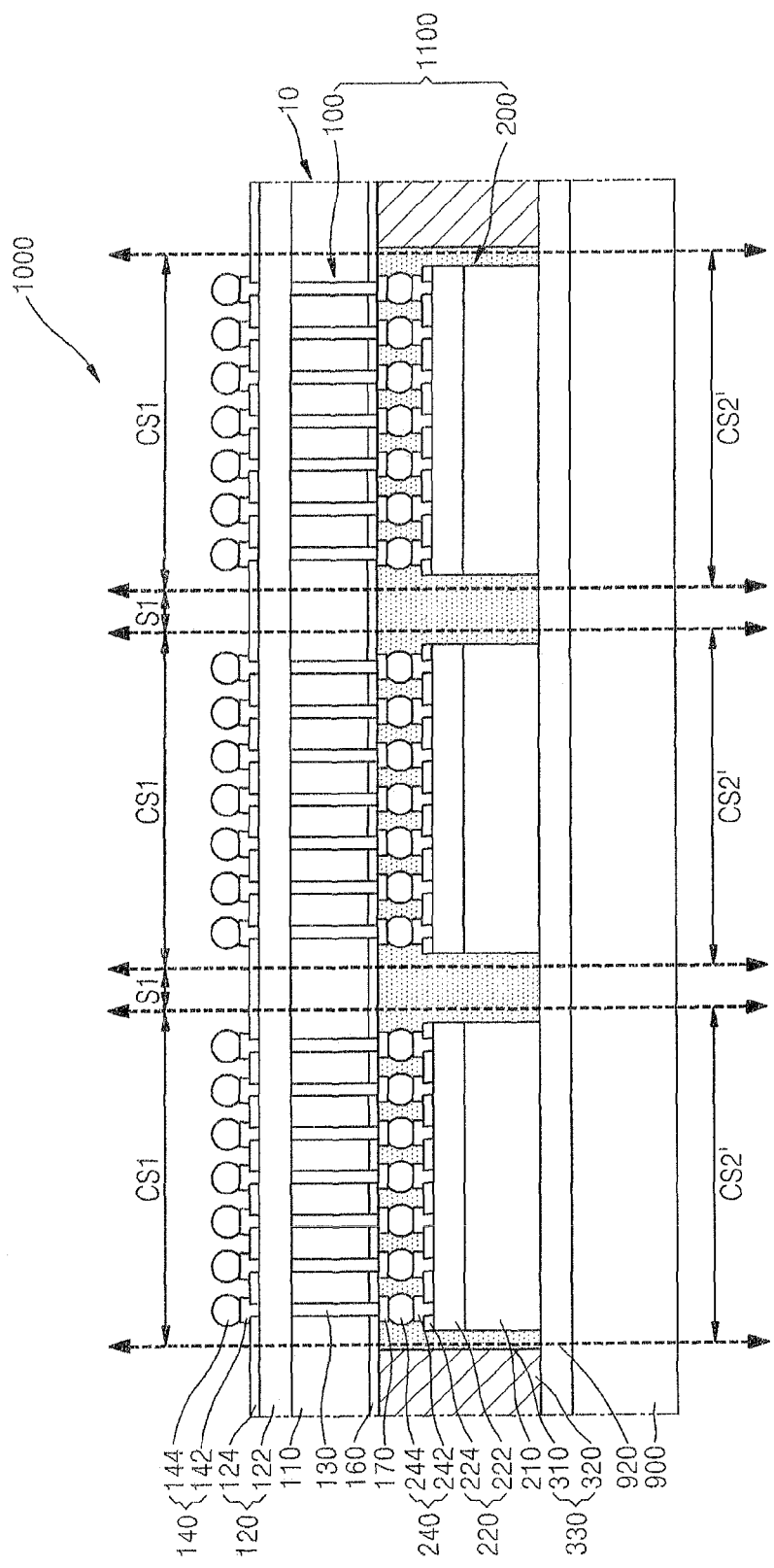

Referring to FIG. 10, after the EDS test, respective chip-stacked semiconductor packages 1000 are separated from each other by sawing through the base wafer 10 and the sealing portion 330. A portion of the adhesive layer 920 may also be removed by sawing.

In FIG. 10, the base wafer 10 and the sealing portion 330 are sawed within the width CS1 of the first chip 100. Because the base wafer 10 and the sealing portion 330 between the second chips 200 are sawed within the blade width S1, which is smaller than the size S2, a sawing process may be easily performed. In this case, the size of the second chip 200, including a portion of the sealing portion 330, i.e., a portion of the underfill 310 may be increased from CS2 to CS2', wherein CS2' is slightly wider than CS2 due to the extra edge remaining after sawing with the narrower blade.

Figure 11:
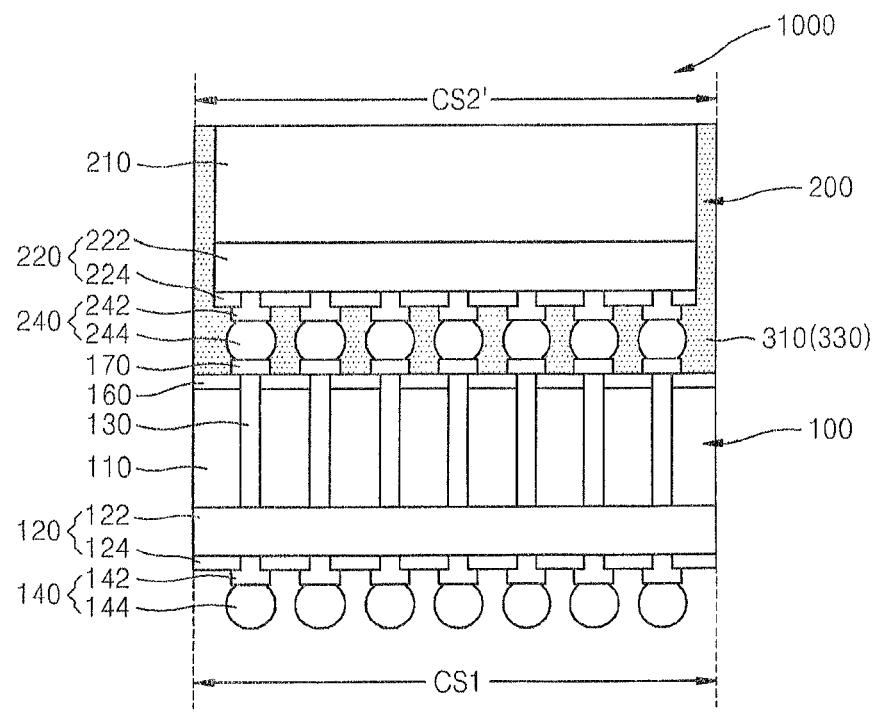

Referring to FIG. 11, the chip-stacked semiconductor package 1000 is completed by removing the supporting substrate 900 and the adhesive layer 920. The removals of the supporting substrate 900 and the adhesive layer 920 may be performed sequentially or simultaneously. After the chip-stacked semiconductor package 1000 is completed through the sawing process described above, both sides of the first chip 100 are exposed. In this case, when the chip-stacked semiconductor packages 1000 are mounted on the board substrate and then molded, an additional molding layer may be attached and bonded to the sides of the first chip 100 well. In an embodiment of the inventive concept, the method of manufacturing a chip-stacked semiconductor package includes the process of mounting the second chip 200 on the base wafer 10, which includes a plurality of first chips 100 in which the TSVs 130 are formed. In this process, the size CS2 of the second chip 200 is prepared so as to be smaller than that of the first chip 100 by using a blade with a wider width S2 when a wafer that contains the second chip 200 is sawed to release the second chip 200.

Accordingly, the underfill process may be easily performed even though the size, for example, the width, of the scribe line region is narrow in a highly integrated wafer. In addition, sawing the base wafer 10 and the sealing portion 330 may be easily performed to obtain the chip-stacked semiconductor package 1000.

According to the method of manufacturing a chip-stacked semiconductor package of the current embodiment, the EDS test is performed with the stacked chip 1100 is mounted on the base wafer 10, which includes the plurality of first chips 100 in which the TSVs 130 are formed. Accordingly, it may be determined whether the stacked chip 1100 is good or defective without using a printed circuit board (PCB) substrate or an interposer. Consequently, a good chip-stacked semiconductor package may be obtained according to the current embodiment.

According to the method of manufacturing a chip-stacked semiconductor package of an embodiment, the upper surface of the stacked chip 1100, i.e., the upper surface of the second chip 200, may be exposed by sealing the stacked chip 1100 including the first chip 100 and the second chip 200 mounted on the base wafer 10, with the sealing portion 330, and then by grinding the sealed stacked chip 1100. In addition, when the chip-stacked semiconductor package 1000 is completed through the sawing process after forming the stacked chip 1100 and the sealing portion 330 on the base wafer 10, both sides of the first chip 100 are exposed. In this case, when the chip-stacked semiconductor package 1000 is mounted on a board substrate and then molded, an additional molding layer may be attached and bonded to the sides of the first chip 100 well.

A structure and characteristics of the chip-stacked semiconductor package manufactured by the aforementioned method of manufacturing a chip-stacked semiconductor package are described below with reference to FIG. 11.

In detail, the chip-stacked semiconductor package 1000 includes a good stacked chip 1100 having a first chip 100, and a second chip 200, and a sealing portion 330. The first chip 100 may include a body layer 110, a lower insulation layer 120, a TSV 130, a first connection unit 140, a protection layer 160, and an upper pad 170. A bump 144 is exposed to the outside at the lower surface of the first chip 100, and a passivation layer 124 of an active surface of the first chip 100 is also exposed to the outside.

The second chip 200, similar to the first chip 100, may include a body layer 210, a lower insulation layer 220, and a second connection unit 240. The second chip 200 may omit a TSV, as illustrated in FIG. 11, but may include a TSV if desired. In the stacked chip 1100, an active surface of the second chip 200 is mounted on an inactive surface of the first chip 100, and the second connection unit 240 of the second chip 200 may be connected to the upper pad 170 of the first chip 100. Thus, the second chip 200 may be electrically connected to the TSV 130 of the first chip 100 through the second connection unit 240 of the second chip 200.

The sealing portion 330 is filled in a connection portion between the first chip 100 and the second chip 200, i.e., a portion in which the upper pad 170 of the first chip 100 is connected to the second connection unit 240 of the second chip 200. The sealing portion portion 330 also surrounds the sides of the second chip 200. Accordingly, the sealing portion 330 that is formed on the sides of the second chip 200 and may be formed of the same material as the sealing portion 330 that is formed in the connection portion between the first chip 100 and the second chip 200.

In an embodiment of the inventive concept, the upper surface of the second chip 200 is exposed to the outside, without a sealing portion formed thereon. The sides of the first chip 100 are also exposed to the outside, without a sealing portion formed thereon. Thus, when the chip-stacked semiconductor package 1000 is mounted on a main chip or a board substrate and then molded, an additional molding layer may be attached and bonded to the upper surface of the second chip 200 and the sides of the first chip 100 well.

The sides of the sealing portion 330 surrounding the sides of the second chip 200 are vertically flush with the sides of the first chip 100. That is, the size CS2' of the second chip 200 including the sealing portion 330 is the same as the size CS1 of the first chip 100.

Figure 12:
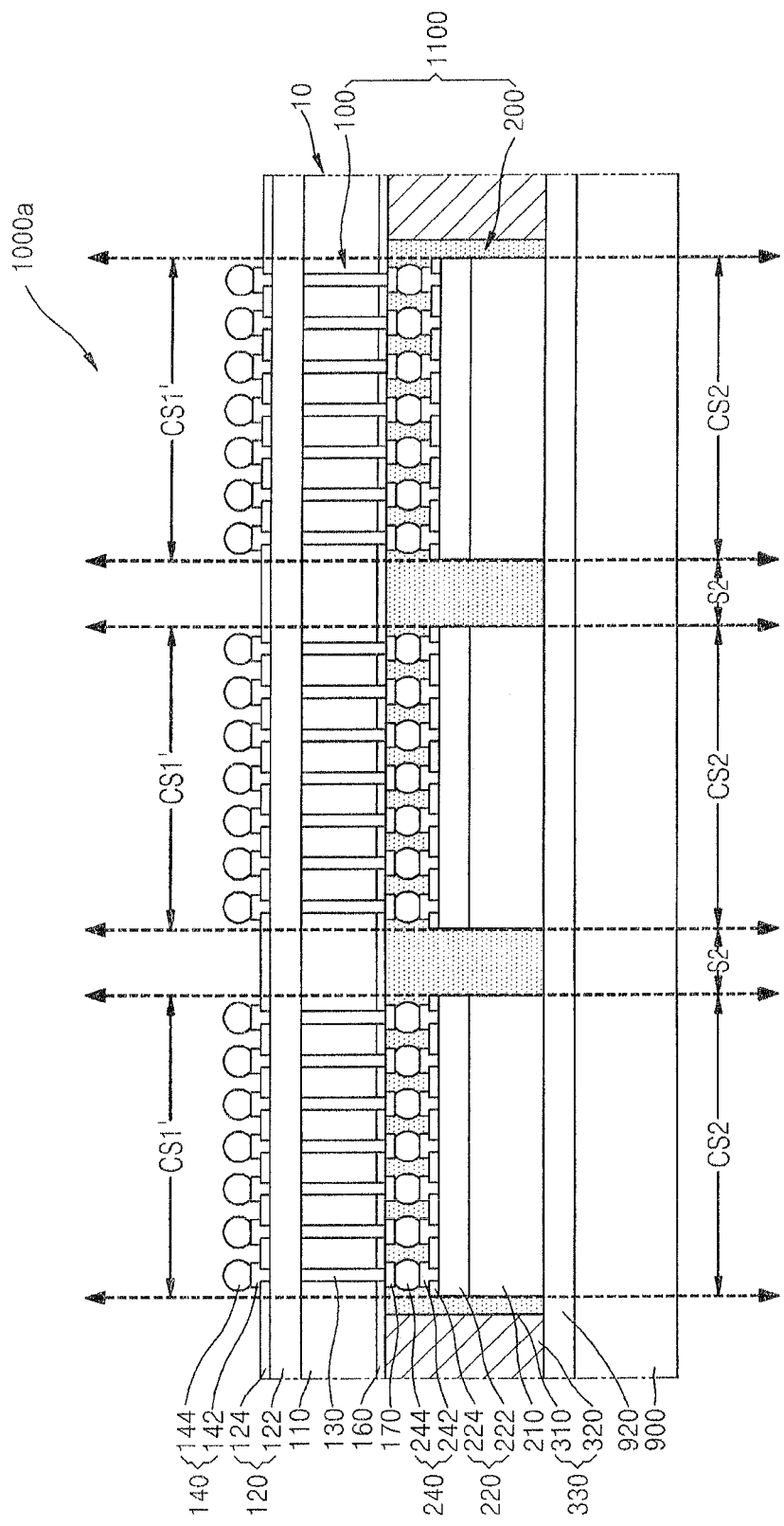
FIGS. 12 and 13 are cross-sectional views illustrating a method of manufacturing a chip-stacked semiconductor package, according to an embodiment of the inventive concept.
Figure 13:
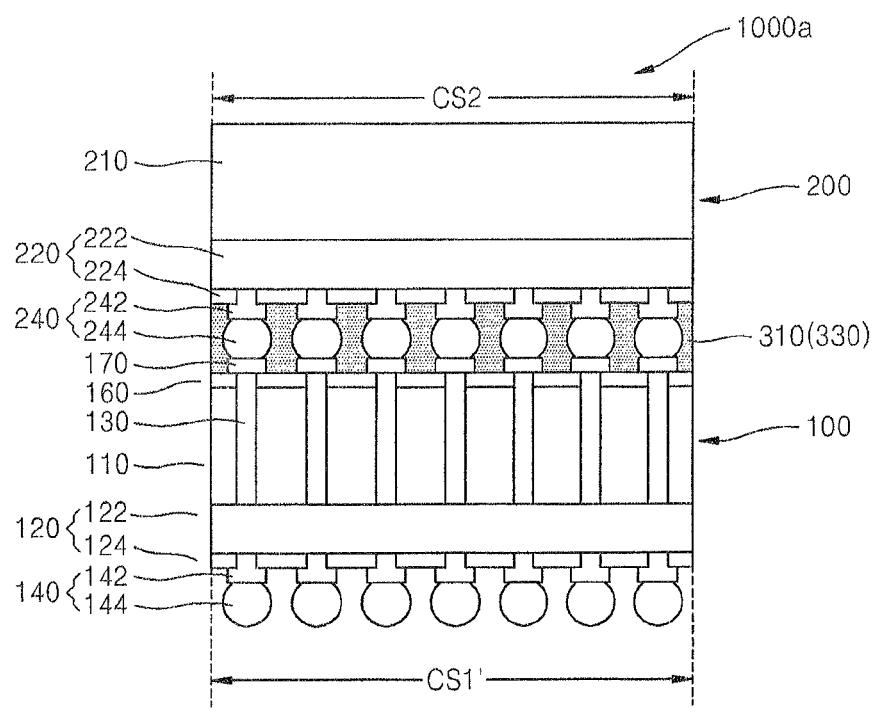

FIGS. 12 and 13 are cross-sectional views illustrating a method of manufacturing a chip-stacked semiconductor package, according to an embodiment of the inventive concept.

FIGS. 12 and 13 show an embodiment identical to that of FIGS. 1 through 11, except for the process of sawing a base wafer and a sealing portion.

First, the manufacturing processes illustrated in FIGS. 1 through 9 are performed. By performing the manufacturing processes, a plurality of second chips 200, sealed by a sealing portion 330, are located on a supporting substrate 900 and are connected to a plurality of first chips 100 included in a base wafer 10, respectively.

Referring to FIG. 12, the base wafer 10 and the sealing portion 330 are sawed on the basis of a width CS2 of the second chip 200 to provide each chip-stacked semiconductor package 1000a. As stated above, S2 may be a blade width, and the base wafer 10 may be sawed on the basis of the blade width S2. In this case, the size of the first chip 100 is the same from CS1 at the top surface to CS1' at the bottom surface.

Referring to FIG. 13, each chip-stacked semiconductor package 1000a is completed by removing the supporting substrate 900 and an adhesive layer 920. A removal of the supporting substrate 900 and the adhesive layer 920 may be sequentially performed or simultaneously performed. After each chip-stacked semiconductor package 1000a is formed through the sawing process of FIG. 12, the sides of the first chip 100 and the sides of the second chip 200 are exposed as illustrated in FIG. 13.

According to the method of manufacturing a chip-stacked semiconductor package of an embodiment illustrated in FIGS. 12 and 13, similar to the embodiment of FIGS. 1 through 11, the size of the second chip 200 is prepared so as to be smaller than that of the first chip 100 by enlarging the blade width S2 when a wafer including the second chip 200 is sawed. Thus, sawing the base wafer 10 and the sealing portion 330 may be easily performed to obtain the chip-stacked semiconductor package 1000a.

According to the method of manufacturing a chip-stacked semiconductor package of an embodiment illustrated in FIGS. 12 and 13, similar to the embodiment of FIGS. 1 through 11, it may be determined whether a stacked chip 1100 is good or defective without using a printed circuit board (PCB) substrate or an interposer. Consequently, a chip-stacked semiconductor package having the stacked chip 1100 which is determined to be good or defective may be obtained.

According to the method of manufacturing a chip-stacked semiconductor package of an embodiment illustrated in FIGS. 12 and 13, similar to the embodiment of FIGS. 1 through 11, the upper surface of the second chip 200 and the sides of the first chip 100 are exposed. In addition, the sides of the second chip 200 are also exposed. In this case, when the chip-stacked semiconductor package 1000a is mounted on a board substrate and then molded, an additional molding layer may be attached and bonded to the sides of the first chip 100 and the sides of the second chip 200 well.

Below, a structure and characteristics of the chip-stacked semiconductor package manufactured by the aforementioned method of manufacturing a chip-stacked semiconductor package are described with reference to FIG. 13.

In detail, the chip-stacked semiconductor package 1000a of FIG. 13 is the same as the chip-stacked semiconductor package 1000 of FIG. 11 except that the sides of the second chip 200 are exposed.

The sealing portion 330 is filled in a connection portion between the first chip 100 and the second chip 200, i.e., a portion in which the upper pad 170 of the first chip 100 is connected to the second connection unit 240, and the sealing portion 330 is not formed on the sides of the second chip 200. However, the sealing portion 330 is not formed on the sides of the first chip 100, and thus, the sides of the first chip 100 are exposed.

Thus, as stated above, when the chip-stacked semiconductor package 1000a is mounted on a board substrate and then molded, an additional molding layer may be attached and bonded to the upper surface of the second chip 200 and the sides of the first chip 100 well.

As stated above, in an embodiment, the sides of the second chip 200 are vertically flush with the sides of each of the first chips 100. That is, the size CS2 of the second chip 200 is the same as the size CS1 of the first chip 100.

FIGS. 14A through 14F are cross-sectional views illustrating a method of manufacturing the base wafer 10 including the first chip 100 used in the method of manufacturing a chip-stacked semiconductor package according to an embodiment of the inventive concept. FIGS. 14A through 14F illustrate only the first chip 100 of the base wafer 10 of the embodiment.

Figure 14A:
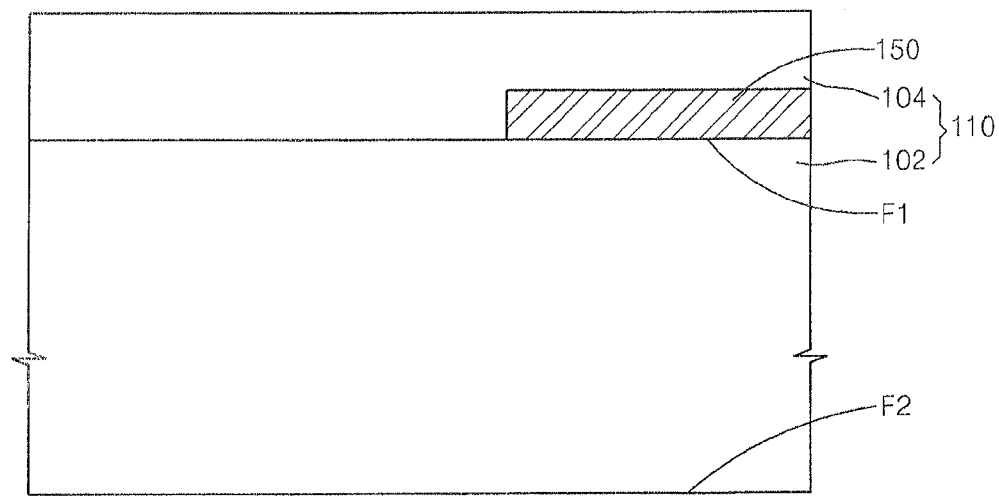
FIGS. 14A through 14F are cross-sectional views illustrating a method of manufacturing a base wafer including a first chip used in a method of manufacturing a chip-stacked semiconductor package, according to an embodiments of the inventive concept.

Referring to FIG. 14A, an integrated circuit layer 150 is formed on a first surface F1 of a semiconductor substrate 102, and then an interlayer insulation layer 104, covering the integrated circuit layer 150, is formed on the first surface F1 of the semiconductor substrate 102. The semiconductor substrate 102 has a second surface F2 opposite to the first surface F1. The semiconductor substrate 102 and the interlayer insulation layer 104 constitute the body layer 110 of the first chip 100.

The semiconductor substrate 102 may be formed with a monocrystalline wafer. The integrated circuit layer 150 may include various circuit devices, for example, transistors and/or capacitors, depending on the kind of chips.

The interlayer insulation layer 104 may be formed using an insulation deposition process, for example, a CVD process. Because the interlayer insulation layer 104 may not be formed flat depending on the profile of the integrated circuit layer 150, a planarization may be performed after the deposition process. The planarization may be performed by using a chemical mechanical polishing (CMP) process or an etch-back process.

Figure 14B:
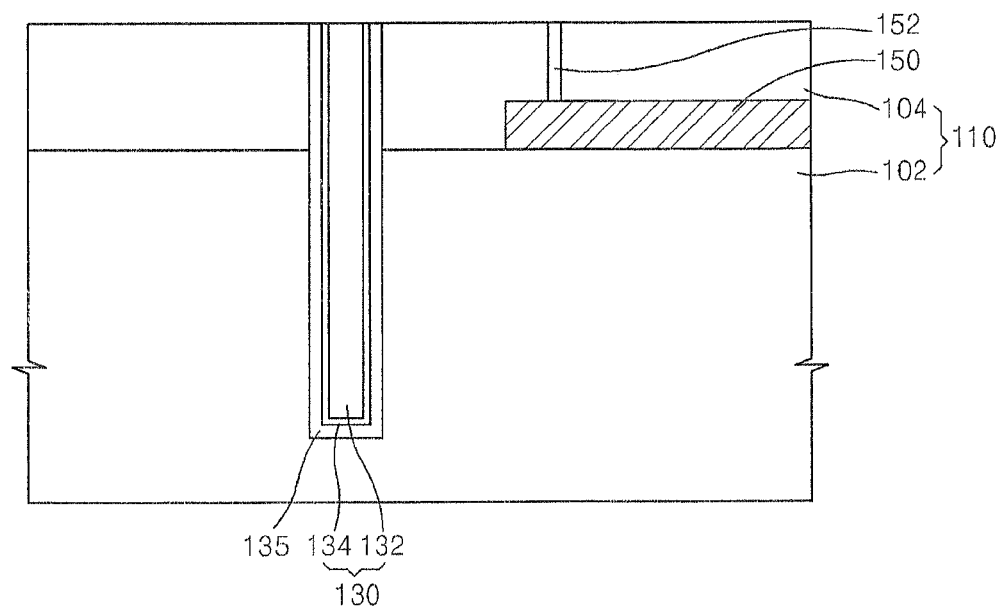

Referring to FIG. 14B, a trench is formed in the interlayer insulation layer 104 and the semiconductor substrate 102, and then a spacer insulation layer 135 and a TSV 130 are formed within the trench. In more detail, a resist pattern (not shown) is formed on the interlayer insulation layer 104, and then using the resist pattern, the interlayer insulation layer 104 and the semiconductor substrate 102 are continuously etched through an etch process. In result, the trench is formed in the interlayer insulation layer 104 and the semiconductor substrate 102. Alternatively, the trench may be formed using a laser drilling process.

The trench may be formed so as not to completely penetrate through the semiconductor substrate 102 in consideration of grinding the second surface F2 of the semiconductor substrate 102 during further processing. The trench may have various shapes depending on the etch conditions or the drilling conditions. For example, the trench may have a relatively uniform cylindrical shape or a shape in which the width of the trench decreases with depth into the semiconductor substrate 102, i.e., the at=s the trench approaches the second surface F2 of the semiconductor substrate 102.

Next, the spacer insulation layer 135 is formed in the trench. For example, the spacer insulation layer 135 may include an insulation layer, for example, an oxide layer, a nitride layer, a polymer layer, or a Parylene® or other poly (p-xylylene) polymer layer, and may be formed using a low temperature deposition process, for example, a low temperature chemical vapor deposition (LTCVD) process, a polymer spraying process, or a low temperature physical vapor deposition (PVD) process.

In an embodiment of the inventive concept, the TSV 130 is formed to completely cover the spacer insulation layer 135. For example, the TSV 130 may be embodied by forming a barrier metal layer 134 on the spacer insulation layer 135 in the trench and then forming an interconnection metal layer 132 on the barrier metal layer 134. The barrier metal layer 134 may include a composition selected from the group consisting of titanium (Ti), tantalum (Ta), titanium nitride (TiN), and tantalum nitride (TaN) or may include a stacked structure including two or more of Ti, Ta, TiN, and TaN. The interconnection metal layer 132 may include a composition selected from tungsten (W), aluminum (Al), and copper (Cu) or may include a stacked structure including two or more of W, Al, and Cu. The barrier metal layer 134 and the interconnection metal layer 132 may be formed using a CVD process, a plasma-enhanced chemical vapor deposition (PECVD) process, a high density plasma-chemical vapor deposition (HDP-CVD) process, a sputtering process, a metal organic chemical vapor deposition (MOCVD) process, or an atomic layer deposition (ALD) process. The interconnection metal layer 132 may be formed using a plating process, and in this case, a plating layer may be formed after forming a seed layer. Here, Cu may be used to form the interconnection metal layer 132 by using the plating process.

A planarization process may be performed after filling the trench. For example, the planarization may be performed using a CMP process or an etch-back process so that the spacer insulation layer 135 and the TSV 130 remain only inside the trench. A preheat process and a buffering CMP process may be performed after the planarization by the CMP process. A metal contact 152 may be formed before forming the TSV 130 or after forming the TSV 130.

Figure 14C:
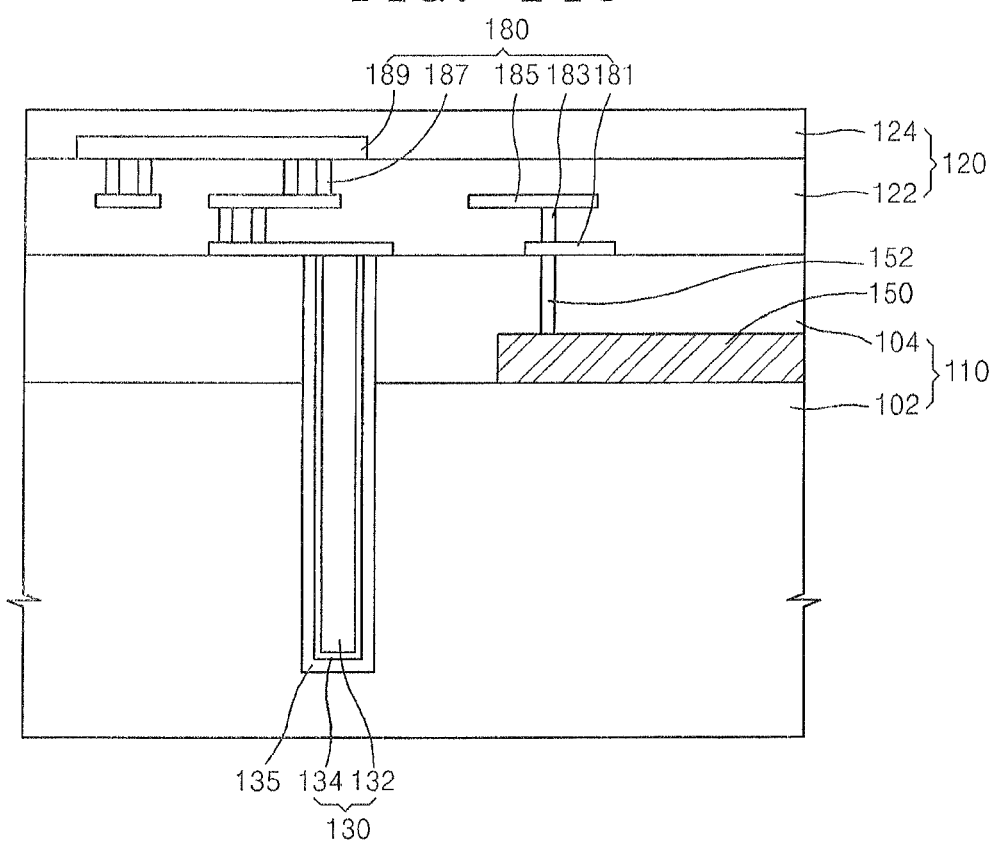

Referring to FIG. 14C, a multilayer interconnection pattern 180 connected with the TSV 130, an inter-metallic insulation layer 122, and a passivation layer 124 may be formed on the planarized surface. The multilayer interconnection pattern 180 may be formed by repeating processes of forming a stacked structure including interconnection lines 181, 185, and 189 and vertical plugs 183 and 187. The inter-metallic insulation layer 122 may have a multilayer structure depending on the stacked structure of the multilayer interconnection pattern 180

The multilayer interconnection pattern 180 may be formed using a material film deposition and patterning process or may be formed using a damascene process. For example, if the multilayer interconnection pattern 180 includes aluminum (Al) and/or tungsten (W), the multilayer interconnection pattern 180 may be formed using the material film deposition and patterning process. On the other hand, if the multilayer interconnection pattern 180 includes copper Cu, the multilayer interconnection pattern 180 may be formed using the damascene process.

Figure 14D:
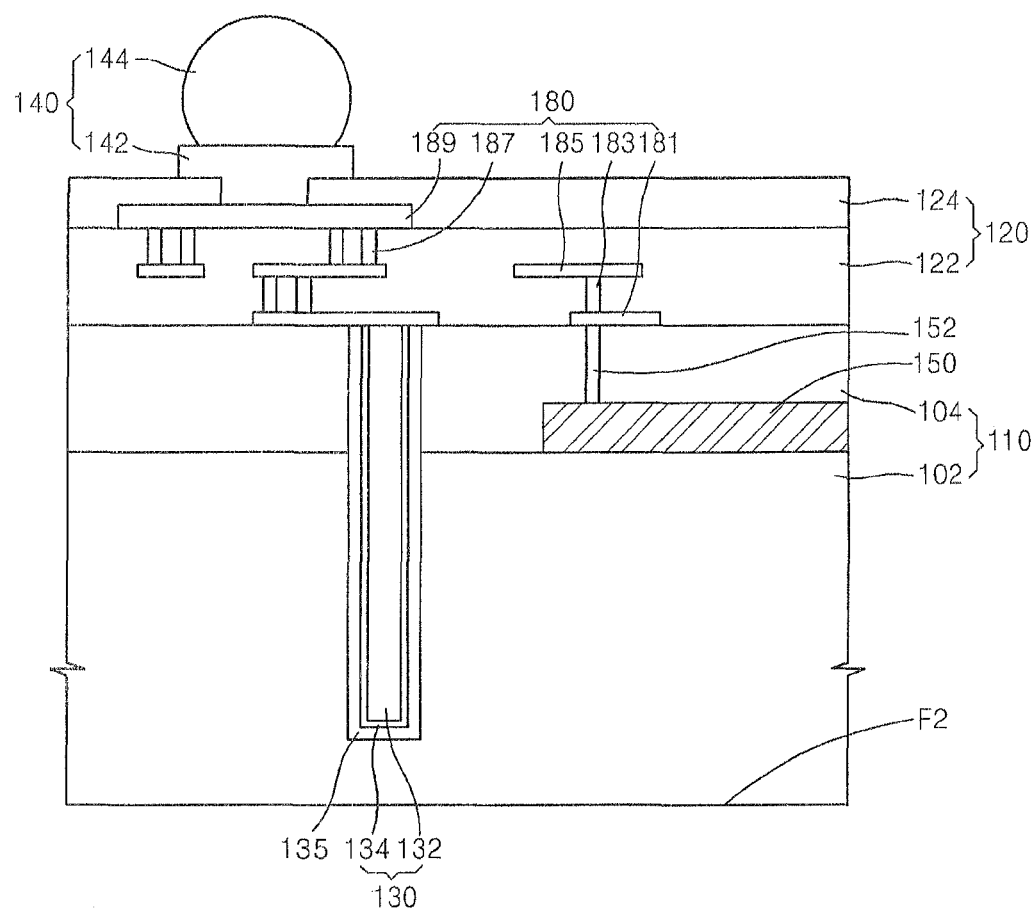

Referring to FIG. 14D, a first connection unit 140, which is connected to the interconnection line 189 of the multilayer interconnection pattern 180, may be formed on the passivation layer 124. The first connection unit 140 may be completed by forming a trench in the passivation layer 124 and forming a bump pad 142 to fill the trench, and then by forming a bump 144 on the bump pad 142.

Figure 14E:
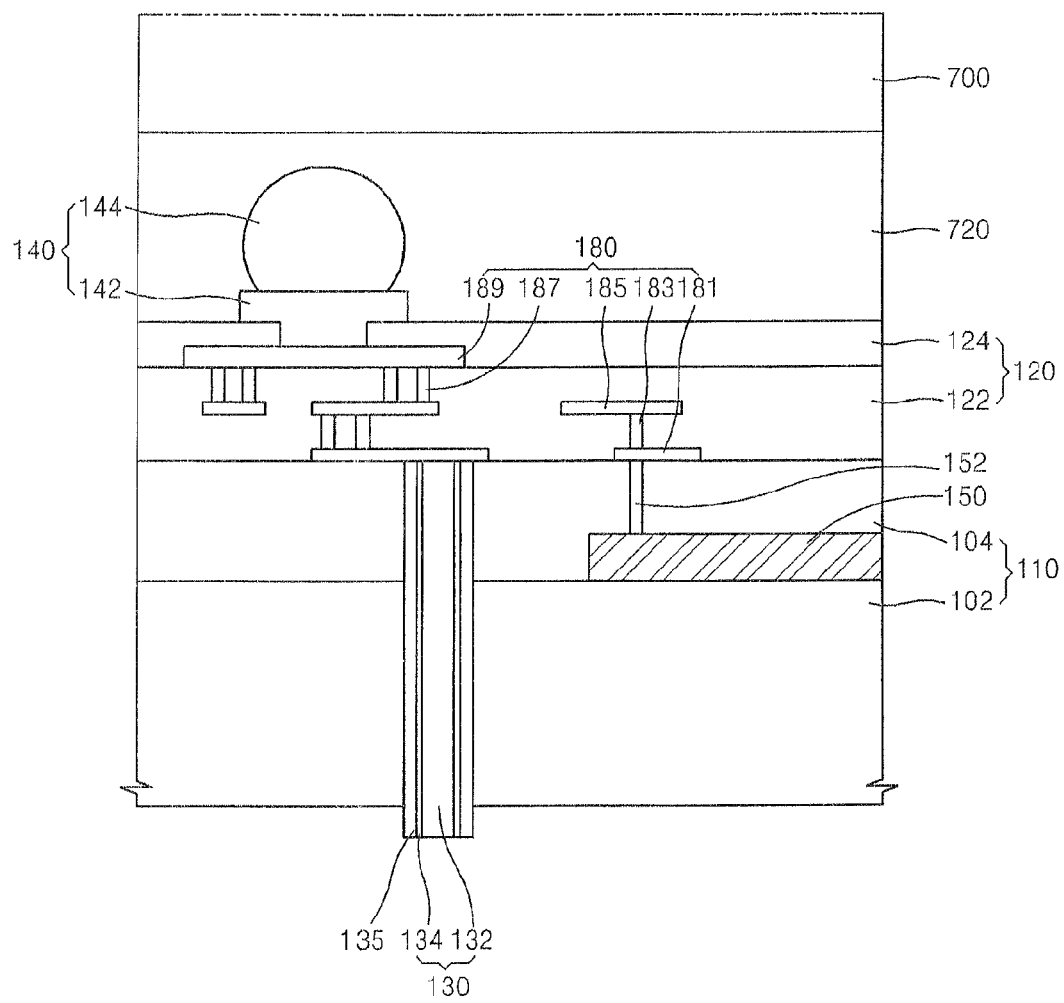

Referring to FIG. 14E, a supporting substrate 700 is bonded to an upper surface of a chip in which the first connection unit 140 is formed, through an adhesive layer 720. The spacer insulation layer 135 and the TSV 130 are exposed by removing a portion of the semiconductor substrate 102 of a predetermined thickness from the second surface F2 of the semiconductor substrate 102. As illustrated in FIG. 14E, the spacer insulation layer 135 and the TSV 130 may be exposed to project from the second surface F2 of the semiconductor substrate 102.

Removal of the portion of the semiconductor substrate 102 may be performed using one or more processes selected from grinding, CMP, isotropic etching, and anisotropic etching. For example, a significant portion of the semiconductor substrate 102 to be removed may be removed by using CMP, and then the semiconductor substrate 102 may be recessed from the bottom surface of the spacer insulation layer 135 and the TSV 130 by using isotropic etching, i.e., wet etching.

Figure 14F:
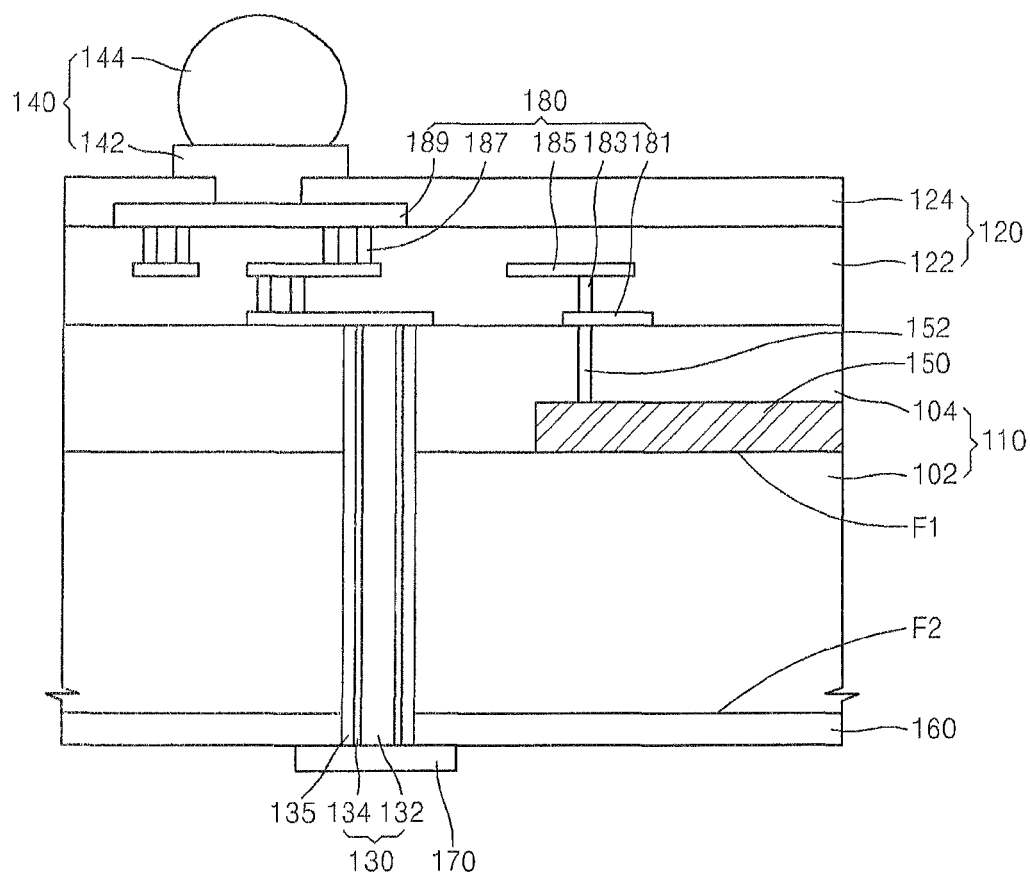

Referring to FIG. 14F, a protection layer 160 is formed on the second surface F2 of the semiconductor substrate 102, and an upper pad 170 is formed on the protection layer 160 to connect to the TSV 130. After forming the upper pad 170, a chip including the TSV 130 having a via-middle structure which is the same as that of the first chip 100 of FIG. 11, by removing the supporting substrate 700, may be formed by removing the supporting substrate 700. The TSV 130 of the current embodiment may be formed with the via-middle structure in which the TSV is formed before forming a multilayer interconnection pattern after forming an integrated circuit layer.

Figure 15:
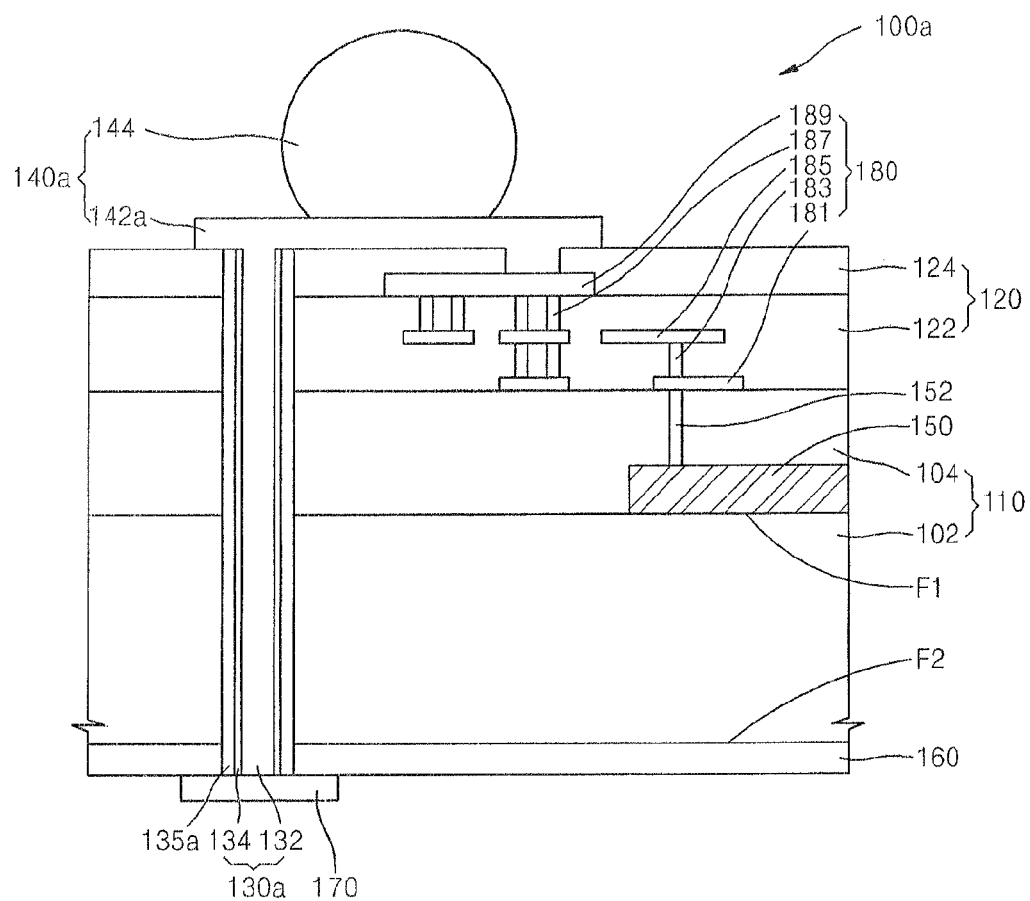
FIG. 15 is a cross-sectional view of a base wafer including a first chip used in a method of manufacturing a chip-stacked semiconductor package, according to an embodiment of the inventive concept.

FIG. 15 is a cross-sectional view of a base wafer including a first chip 100a used in a method of manufacturing a chip-stacked semiconductor package, according to an embodiment of the inventive concept.

The first chip 100a may have a structure similar to that of the first chip 100 of FIG. 14, except for the structure of a TSV portion. Thus, for convenience of explanation, portions stated in the above explanation of FIGS. 14A through 14F will be omitted or briefly stated.

In detail, in the first chip 100a of an embodiment, a TSV 130a may be formed with a via-last structure. Thus, the TSV 130a may be directly connected to a bump pad 142a of a first connection unit 140a through a semiconductor substrate 102, an interlayer insulation layer 104, an inter-metallic insulation layer 122, and a passivation layer 124. The TSV 130a and a spacer insulation layer 135a on the sidewalls of the TSV 130a are the same as those illustrated in FIGS. 14A through 14F.

FIGS. 16A and 16B are cross-sectional views illustrating a method of manufacturing a second chip used in a method of manufacturing a chip-stacked semiconductor package, according to an embodiment of the inventive concept.

Referring to FIG. 16A, a wafer 20 that includes a plurality of second chips 200 is prepared. The wafer 20 may be bonded to a supporting substrate 840 through an adhesive layer 860. In the wafer 20, a size of a chip region is indicated by CR1, similar to the first chip 100. The size CR1 of the chip region may be defined by a width or a length thereof. A size of a scribe line region between the second chips 100 is indicated by SR1, similar to the first chip 100. The size SR1 of the scribe line region may be along a width or a length of the chips 200.

The supporting substrate 840, as stated above, may be formed of silicon, germanium, silicon-germanium, gallium-arsenic (GaAs), glass, plastic, ceramic, or the like. The adhesive layer 860 may be formed as an NCF, an ACF, an instant adhesive, a thermosetting adhesive, a laser-setting adhesive, an ultrasonic-setting adhesive, an NCP, or the like. The wafer 20 may be bonded so that a first connection unit 240 faces the supporting substrate 840.

Referring to FIG. 16B, the second chips 200 are separated from each other by sawing the scribe line region of the wafer 20. The sizes of the second chips 200 are indicated as "CS2". The size CS2 of the second chips 200 may be defined by a width or a length. A size of a region sawed by a blade inside the scribe line region is indicated as "S2". The size S2 may be along a width or a length. The size S2 may be a width of the blade.

FIGS. 17A and 17B are cross-sectional views illustrating a method of manufacturing a second chip used in a method of manufacturing a chip-stacked semiconductor package, according to an embodiment of the inventive concept.

Second chips 200a illustrated in FIGS. 17A and 17B are the same as the second chips 200 illustrated in FIGS. 16a and 16b, except that TSVs 230 are formed in the chips of FIGS. 17A and 17B.

Referring to FIG. 17A, a wafer 20 is prepared, including the second chips 200a in which the TSVs 230 are formed. The wafer 20 may be bonded to a supporting substrate 840 through an adhesive layer 860. The wafer 20, as illustrated in FIGS. 17A and 17B, may be manufactured by using the same process as that of manufacturing the base wafer 10.

Referring to FIG. 17B, the second chips 200a are separated from each other by sawing along a scribe line region of the wafer 20. The sizes of the second chips 200a are indicated as "CS2". The size CS2 of each of the second chips 200a may be defined by a width or a length. A size of a region sawed by a blade inside the scribe line region is indicated as "S2". The size S2 may be along a width or a length.

Figure 18:
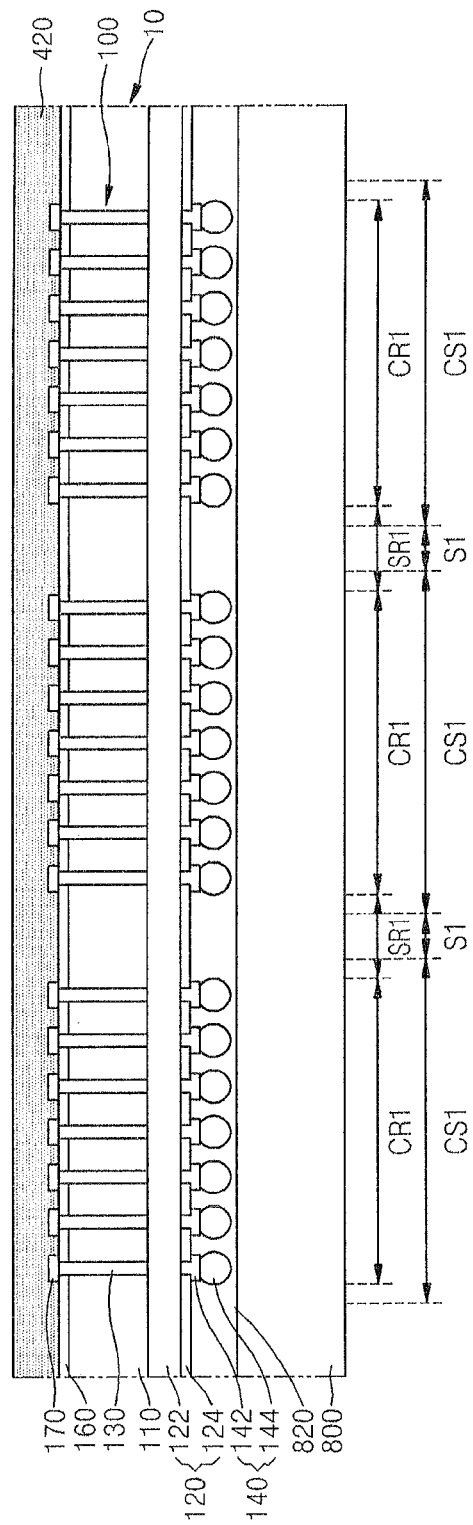
FIGS. 18 and 19 are cross-sectional views illustrating a method of manufacturing a chip-stacked semiconductor package, according to an embodiment of the inventive concept.
Figure 19:
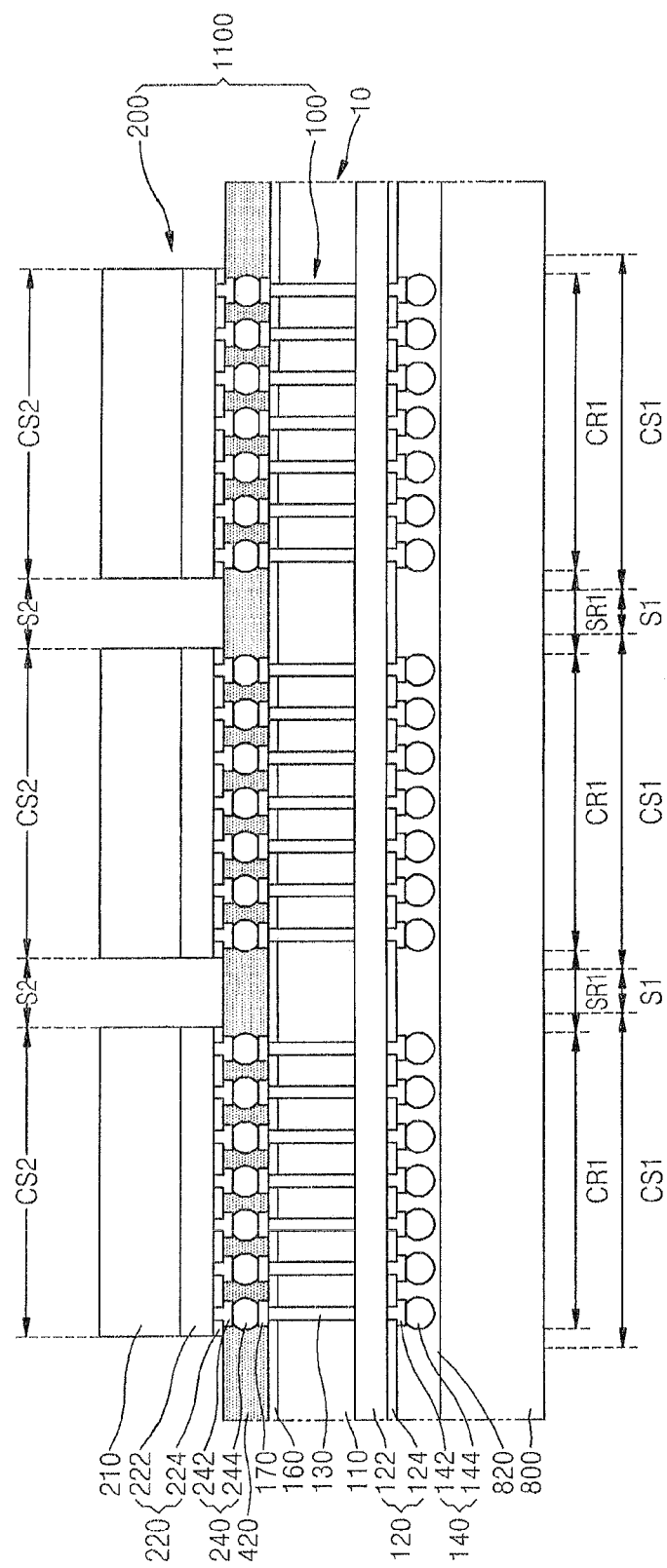

FIGS. 18 and 19 are cross-sectional views illustrating a method of manufacturing a chip-stacked semiconductor package, according to an embodiment of the inventive concept.

The embodiment of FIGS. 18 and 19 is the same as the aforementioned embodiments except that an adhesive layer 420 is formed on a base wafer 10 and the underfill 310 is not formed on the base wafer 10.

Referring to FIG. 18, the adhesive layer 420, covering a protection layer 160 and an upper pad 170, is formed on the base wafer 10, similar to that illustrated in FIG. 1. The adhesive layer 420 may be an NCF or an ACF. In an embodiment, an NCF may be used. The adhesive layer 420 may be formed by bonding the NCF to the base wafer 10 after forming the protection layer 160 and the upper pad 170.

The NCF is a film having insulation characteristics as a general adhesive film. When the NCF is used, a second chip 200 may be stacked on a first chip 100 by a pressuring method. The ACF has a structure in which conductive particles are distributed inside an insulation adhesive film, and may have anisotropic electrical characteristics in which electric current is applied only in an electrode direction, i.e., in a vertical direction, and is insulated in a direction between an electrode and another electrode, i.e., in a horizontal direction, during bonding. In the ACF, when an adhesive is melted by applying heat and pressure, conductive particles are arranged between electrodes opposite each other, and thus, conductivity occurs. On the other hand, the adhesive is filled between adjacent electrodes, and thus, the adjacent electrodes are insulated from each other.

Referring to FIG. 19, a stacked chip 1100 is formed by stacking the second chip 200 on the adhesive layer 420 on the base wafer 10 including the first chip 100, by using the same method as that of FIG. 3. The stack is accomplished by bonding a second connection unit 240 of the second chip 200 to an upper pad 170 of the first chip 100 using a pressure method.

In the case of stacking the second chip 200 on the first chip 100, a connection portion between the first chip 100 and the second chip 200 of the stacked chip 1100 is not filled with the underfill but is filled instead with the adhesive layer 420. In this case, the method of manufacturing a chip-stacked semiconductor package is simplified because the underfill process may be omitted.

Then, a chip-stacked semiconductor package is completed through a molding and sawing process by using the manufacturing process described above, for example, by using the methods described with reference to FIGS. 5 through 11 and FIGS. 12 and 13.

Figure 20:
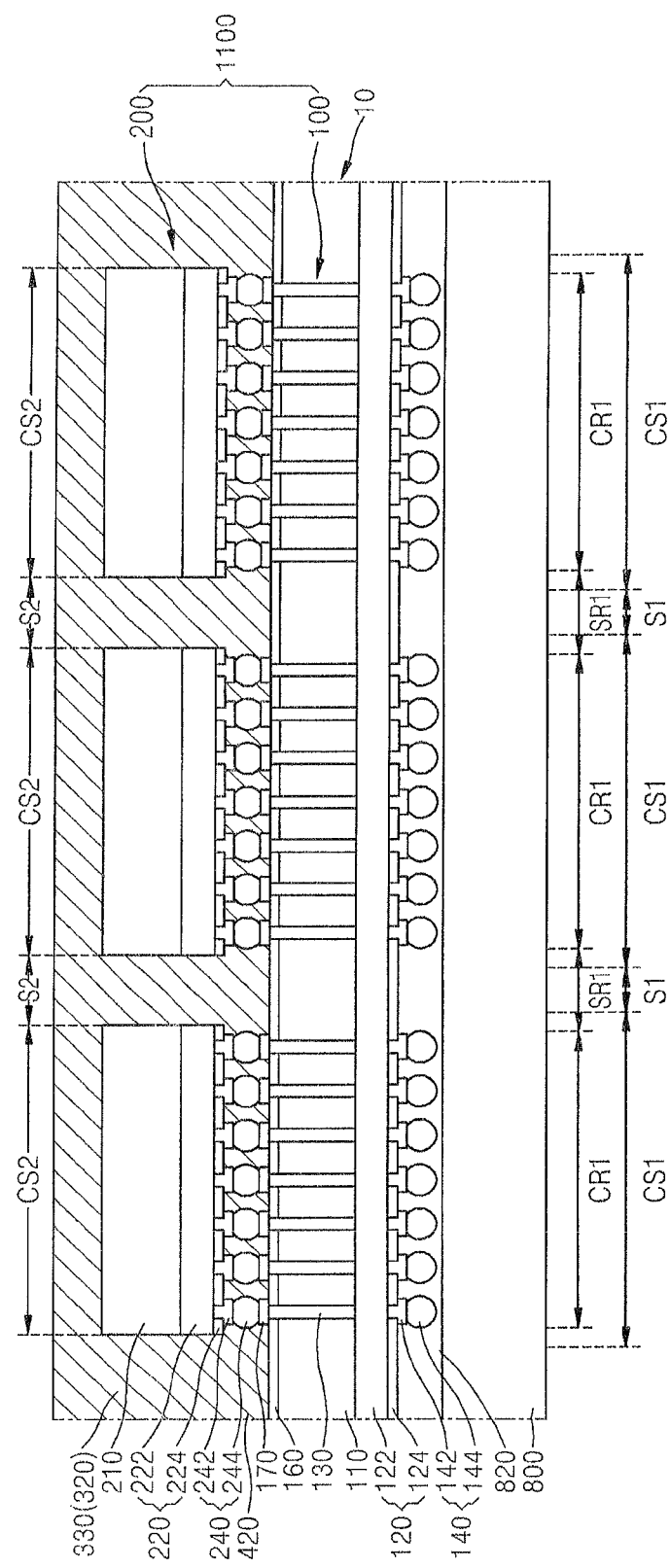
FIGS. 20 and 21 are cross-sectional views illustrating a method of manufacturing a chip-stacked semiconductor package, according to an embodiment of the inventive concept.
Figure 21:
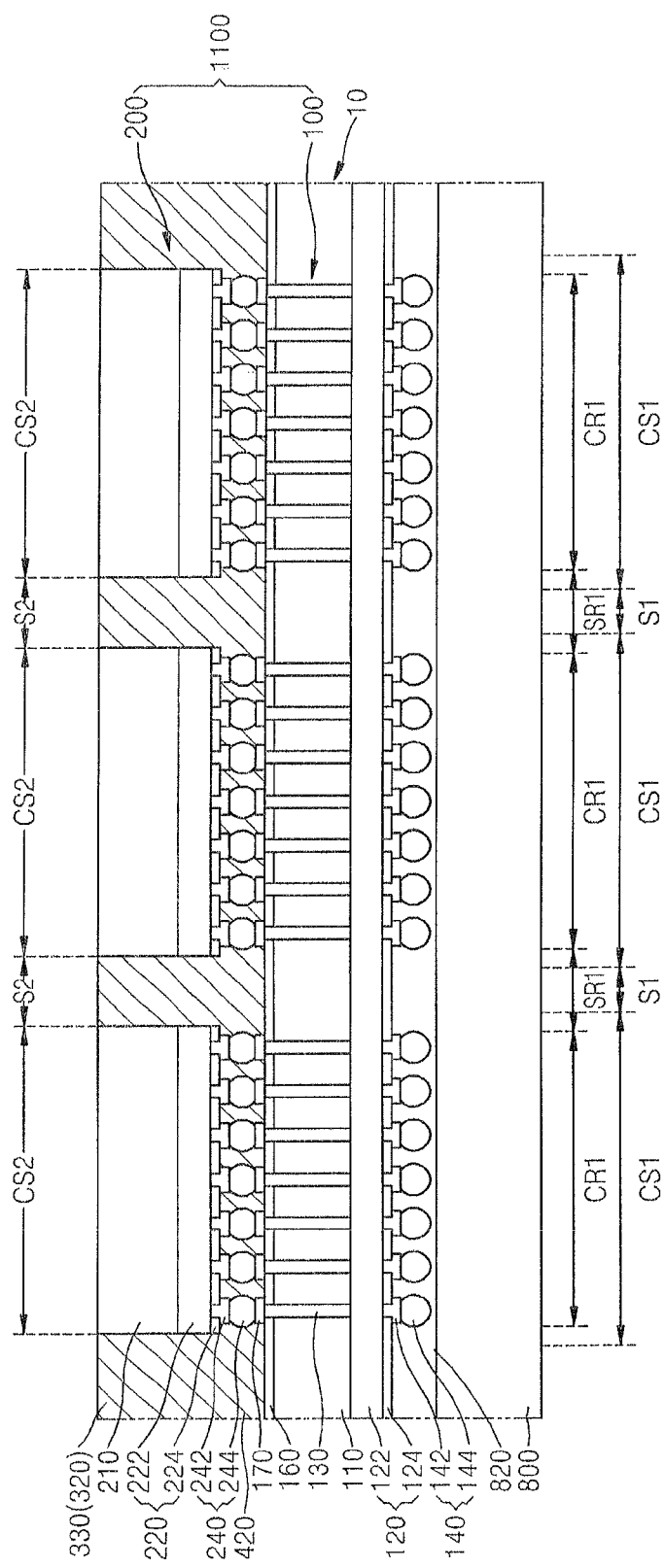

FIGS. 20 and 21 are cross-sectional views illustrating a method of manufacturing a chip-stacked semiconductor package, according to an embodiment of the inventive concept.

The embodiment of FIGS. 20 and 21 is the same as that of FIGS. 18 and 19 except that the underfill 310 is not formed and a sealing portion 330 is formed with a molding layer 320.

First, the manufacturing processes of FIGS. 1 through 3 are performed. By these processes, a second chip 200 is stacked on an adhesive layer 420 on a base wafer 10 including a first chip 100, and thus a stacked chip 1100 is formed.

Referring to FIG. 20, the sealing portion 330 is formed by forming the molding layer 320 sealing the sides and the upper surface of the second chip 200, filling a connecting portion between the first chip 100 and the second chip 200 of the stacked chip 1100.

The molding layer 320 may fill the connecting portion between the first chip 100 and the second chip 200, i.e., a portion in which an upper pad 170 of the first chip 100 is connected to a second connection unit 240 of the second chip 200. The molding layer 320, as stated above, may be formed with a polymer such as a resin. For example, the molding layer 320 may be formed with an EMC. The sealing portion 330 may seal the sides and the upper surface of the first and second chips 100 and 200 of each of the stacked chips 1100.

Referring to FIG. 21, the upper surface of the second chip 200 of each of the stacked chips 1100 may be exposed by grinding the upper surface of the sealing portion 330. In this case, the stacked chips 1100 are sealed with the sealing portion 330 including the molding layer 320. The sealing portion 330 may seal the sides of the first and second chips 100 and 200 of each of the stacked chips 1100.

Then, as illustrated in the preceding manufacturing processes, for example, as illustrated in FIGS. 7 through 11 and FIGS. 12 and 13, a chip-stacked semiconductor package is completed through a test process and a sawing process.

Figure 22:
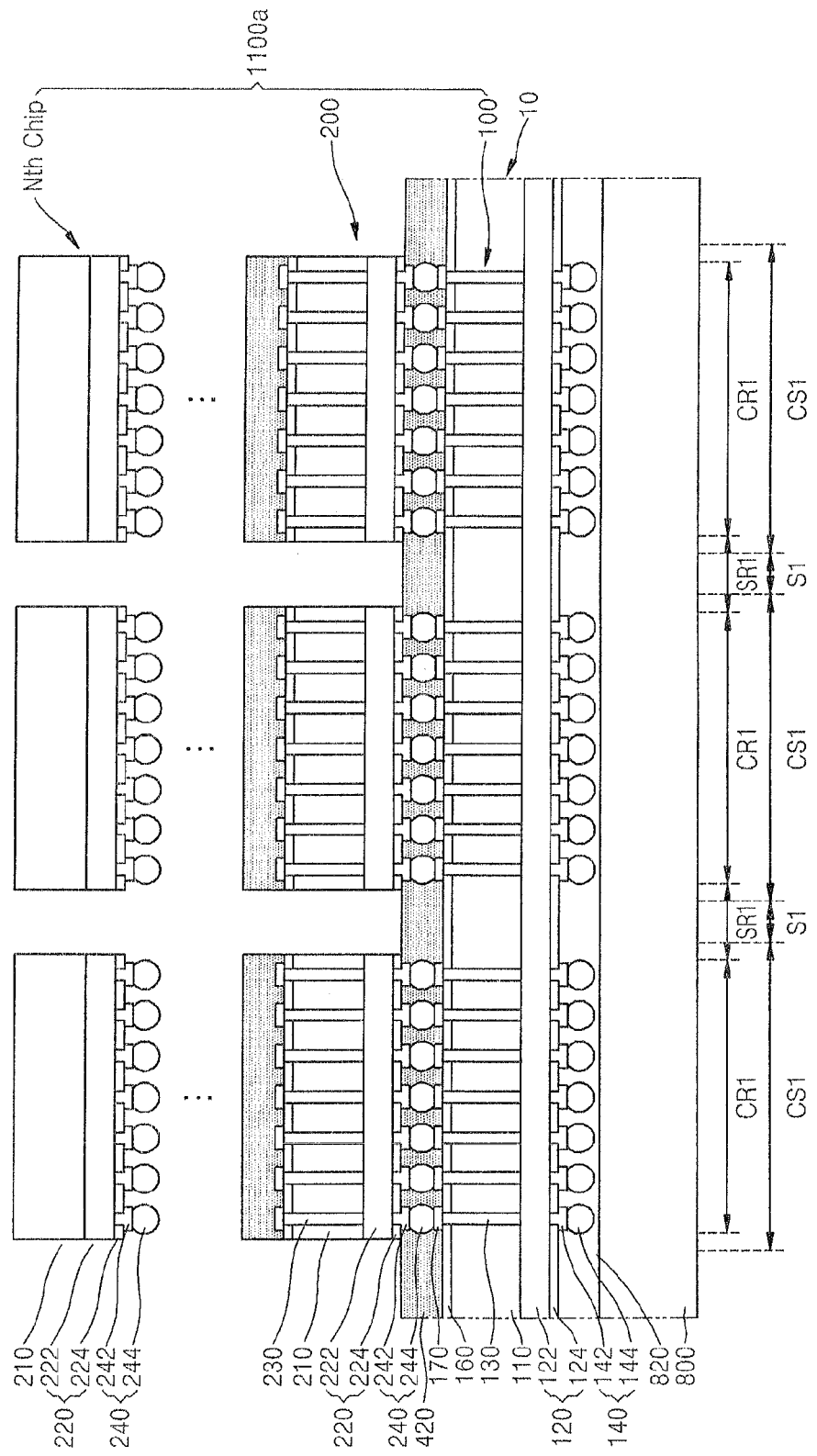
FIG. 22 is a cross-sectional view illustrating a method of manufacturing a chip-stacked semiconductor package, according to an embodiment of the inventive concept.

FIG. 22 is a cross-sectional view illustrating a method of manufacturing a chip-stacked semiconductor package, according to an embodiment of the inventive concept.

The embodiment of FIG. 22 is the same as the aforementioned embodiments except that a stacked chip 1100a is formed by stacking a plurality of second chips 200 on each first chip 100 of a base wafer 10, respectively.

Referring to FIG. 22, the stacked chip 1100a is formed by stacking at least two second chips 200 on each of the first chips 100 of the base wafer 10. A single second chip 200 may be stacked on each of the first chips 100 of the base wafer 10, and a second chip set of two or more second chips 200 may be stacked on each of the first chips 100 of the base wafer 10. For example, a chip-stacked semiconductor package such as the chip-stacked semiconductor package 1000 of FIG. 11 or the chip-stacked semiconductor package 1000a of FIG. 13 may be stacked on the first chip 100.

A connection portion between the first chip 100 and the second chip 200 may be filled with an adhesive layer 420 such as the NCF. A connection portion between the second chips 200 may be also filled with the adhesive layer 420 such as the NCF. The adhesive layer 420 may not be formed on upper surfaces of the highest second chips (Nth chips shown in FIG. 22), and the TSVs are not formed in the highest second chip.

As stated above, a connection portion between the first chip 100 and the second chip 200 may be filled with a sealing portion 330 such as the underfill 310 or the molding layer 320.

Figure 23:
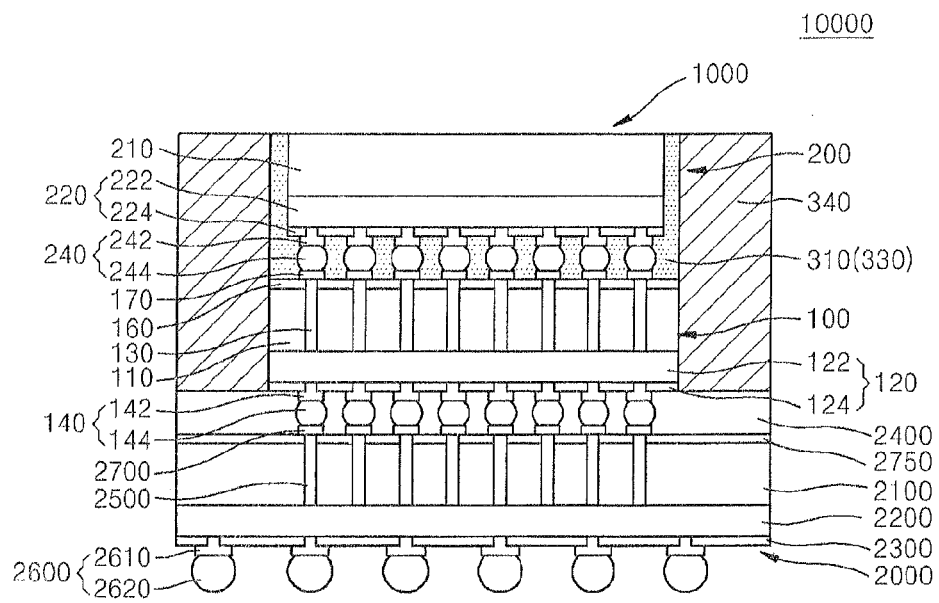
FIGS. 23 and 24 are each cross-sectional views of chip-stacked semiconductor packages according to an embodiment of the inventive concept.
Figure 24:
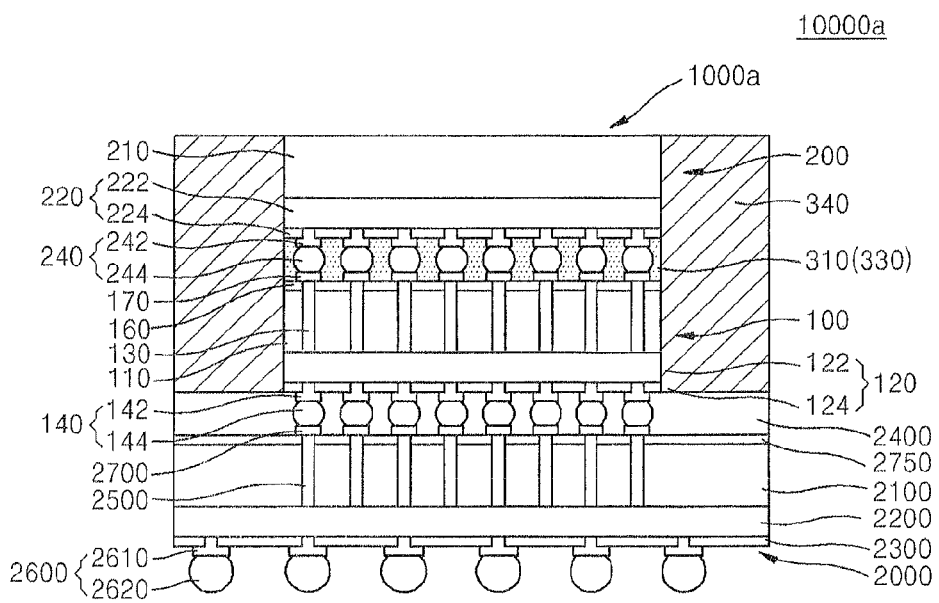

FIGS. 23 and 24 are cross-sectional views of chip-stacked semiconductor packages 10000 and 10000a according to embodiments of the inventive concept.

Referring to FIG. 23, the chip-stacked semiconductor package 10000 may include a main chip 2000 and an upper semiconductor package 1000. The upper semiconductor package 1000 may be the same as that of the chip-stacked semiconductor package of FIG. 11. Thus, an explanation for elements of the upper semiconductor package 1000 will be omitted or briefly described.

The upper semiconductor package 1000 is stacked on the main chip 2000, and is sealed with a second sealing portion 340. A first sealing portion 330 including an underfill 310 is formed on the sides of a second chip 200, and the second sealing portion 340 is formed on the sidewalls of the first sealing portion 330 to seal the upper semiconductor package 1000. As stated above, the second sealing portion 340 may be formed with a mold layer.

The size of the main chip 2000 may be larger than those of the first and second chips 100 and 200 included in the upper semiconductor package 1000.

A size of a horizontal section of the main chip 2000 may be the same as that of a total horizontal section of the upper semiconductor package 1000, i.e., a horizontal section including the second sealing portion 340. The upper semiconductor package 1000 may be mounted on the main chip 2000 through an adhesive layer 2400. Thus, the lower surface of the second sealing portion 340 of the upper semiconductor package 1000 may be bonded to the outskirts of the upper surface of the main chip 2000 through the adhesive layer 2400.

The main chip 2000, similar to a memory chip, may include a body layer 2100, a lower insulation layer 2200, a passivation layer 2300, a TSV 2500, a third connection unit 2600, a protection layer 2750, and an upper pad 2700. An integrated circuit layer and a multilayer interconnection pattern inside the lower insulation layer 2200 and the passivation layer 2300 may be formed differently depending on a type of the main chip 2000. The main chip 2000 may be a logic chip, for example, a central processing unit (CPU), a controller, or an application specific integrated circuit (ASIC).

The number of TSVs 2500 and the number of upper pads 2700 corresponding to the TSV 2500 may correspond to the number the first connection units 140 of the first chip 100 of the upper semiconductor package 1000 which is stacked on the main chip 2000. If desired, the number of the TSV 2500 may be different from, for example, larger than, that of the first connection unit 140.

The third connection unit 2600 formed in a lower surface of the main chip 2000 may include a bump pad 2610 and a bump 2620, and the number of third connection units 2600 may be less than that of TSVs 2500. In this case, a TSV that does not have a corresponding third connection unit 2600 may be connected to one third connection unit 2600 through a multilayer interconnection pattern. That is, two or more TSVs may be connected to one third connection unit 2600 through a multilayer interconnection pattern.

The size of the third connection unit 2600 formed in the main chip 2000 is larger than that of the first connection unit 140 of the upper semiconductor package 1000. The reason is that wirings formed in a board substrate (not shown) on which the main chip 2000 is mounted are difficult to arrange at high density due to standardization of the wirings or physical characteristics of the board substrate. For this reason, the TSVs 2500 may not correspond to the third connection units 2600, respectively.

The chip-stacked semiconductor package 10000*a* according to the embodiment of FIG. 24 may have a similar structure to that of the chip-stacked semiconductor package 10000 of FIG. 23, except for the upper semiconductor package 1000. Thus, for convenience of explanation, portions stated in the above explanation of FIG. 23 will be omitted or briefly stated.

Referring to FIG. 23, in the chip-stacked semiconductor package 10000*a* of the current embodiment, the upper semiconductor package 1000*a* may be the same as the chip-stacked semiconductor package 1000*a* of FIG. 13. Thus, the sides of the second chip 200 of the upper semiconductor package 1000*a* are exposed, and then the upper semiconductor package 1000*a* is sealed by forming the second sealing portion 340 on the sides of the second chip 200.

Figure 25:
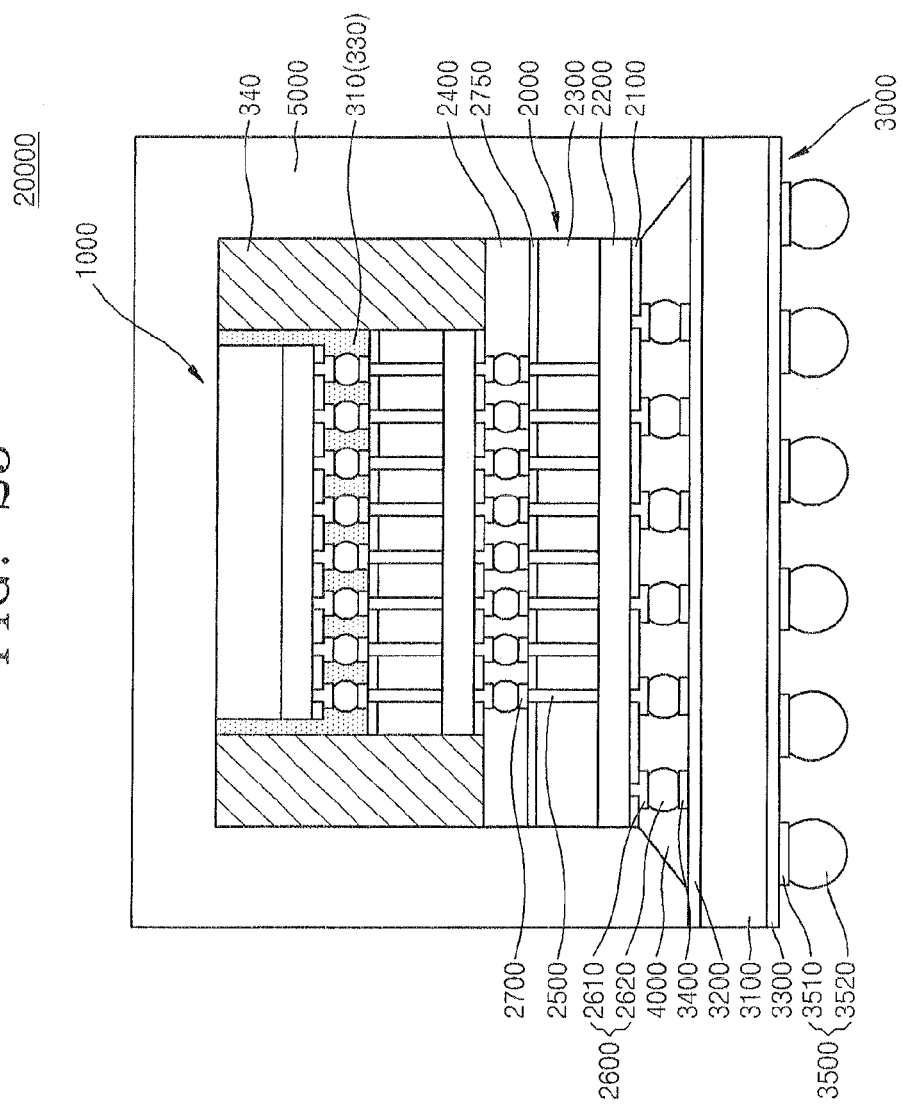
FIGS. 25 and 26 are each cross-sectional views of chip-stacked semiconductor packages according to an embodiment of the inventive concept.
Figure 26:
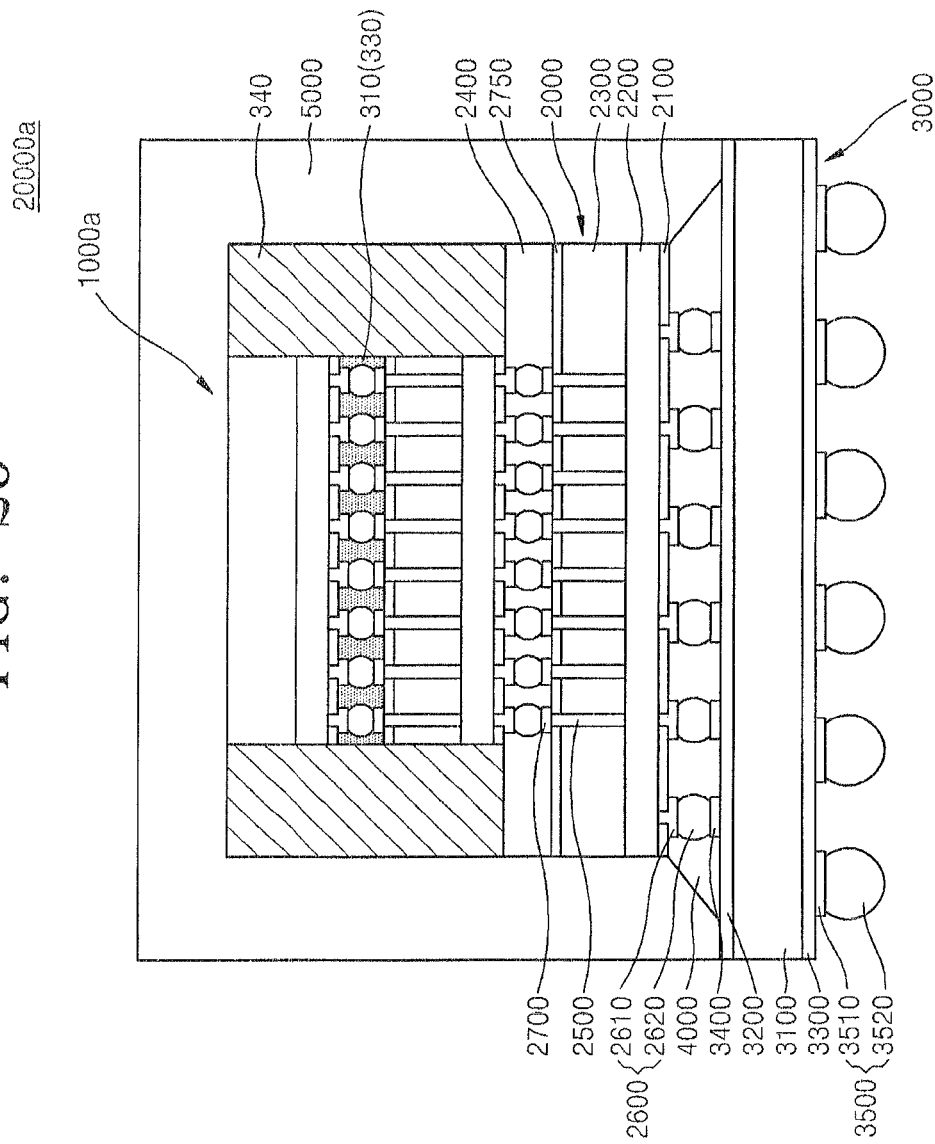

FIGS. 25 and 26 are cross-sectional views of chip-stacked semiconductor packages 20000 and 20000*a* according to embodiments of the inventive concept.

The chip-stacked semiconductor package 20000 of FIG. 25 may include a board substrate 3000, a main chip 2000, an upper semiconductor package 1000, an underfill 4000, and a third sealing portion 5000. The chip-stacked semiconductor package 20000*a* of FIG. 26 may have a similar structure to that of the chip-stacked semiconductor package 20000, except for an upper semiconductor package 1000*a*.

The structures of the upper semiconductor package 1000 or 1000*a* and the main chip 2000 may be the same as those illustrated in FIGS. 23 and 24. Accordingly, detailed explanations for the elements of the upper semiconductor package 1000 or 1000*a* and the main chip 2000 will be omitted. The upper semiconductor package 1000 or 1000*a* and the main chip 2000 may be mounted on the board substrate 2000 through a third connection unit 2600.

The board substrate 3000 may include a body layer 3100, an upper protection layer 3200, a lower protection layer 3300, an upper pad 3400, and a fourth connection unit 3500. A plurality of interconnection patterns may be formed in the body layer 3100. The upper protection layer 3200 and the lower protection layer 3300 may have a function for protecting the body layer 3100, and, for example, may be formed with solder resist. The board substrate 3000 is standardized, as stated above, and has a limitation in reduction of size. Accordingly, additional explanation for the board substrate 3000 will be omitted.

The third sealing portion 5000 seals the sides and the upper surface of the upper semiconductor package 1000 or 1000*a* and the sides of the main chip 2000, and the lower side of the third sealing portion 5000 may be bonded to outside of the board substrate 3000. The underfill 4000 fills a connection portion between the main chip 2000 and the board substrate 3000. In the current embodiment, the underfill 4000 is formed in the connection portion between the main chip 2000 and the board substrate 3000. However, if the third sealing portion 5000 is formed through an MUF process, the underfill 4000 may be omitted.

Figure 27:
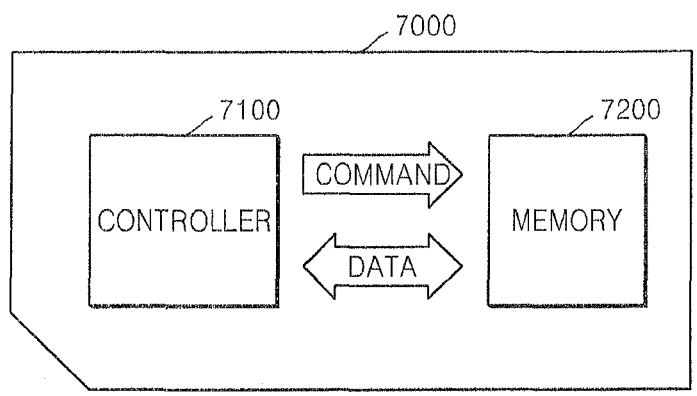
FIG. 27 is a schematic block diagram illustrating a memory card including a chip-stacked semiconductor package according to an embodiment of the inventive concept.

FIG. 27 is a block diagram illustrating a memory card 7000 including a chip-stacked semiconductor package according to an embodiment of the inventive concept.

Referring to FIG. 27, a controller 7100 and a memory 7200 may be disposed to send/receive electric signals to/from each other. For example, when the controller 7100 sends a command to the memory 7200, the memory 7200 may send data. The controller 7100 and/or the memory 7200 may include a chip-stacked semiconductor package according to an embodiment of the inventive concept. The memory 7200 may include memory arrays (not shown) or memory array banks (not shown), all of which are known in the art.

The memory card 7000 may be used in memory devices as a memory card, for example, such as a memory stick card, a smart media (SM) card, a secure digital (SD) card, a mini SD card, a micro SD card or a multi media card (MMC).

Figure 28:
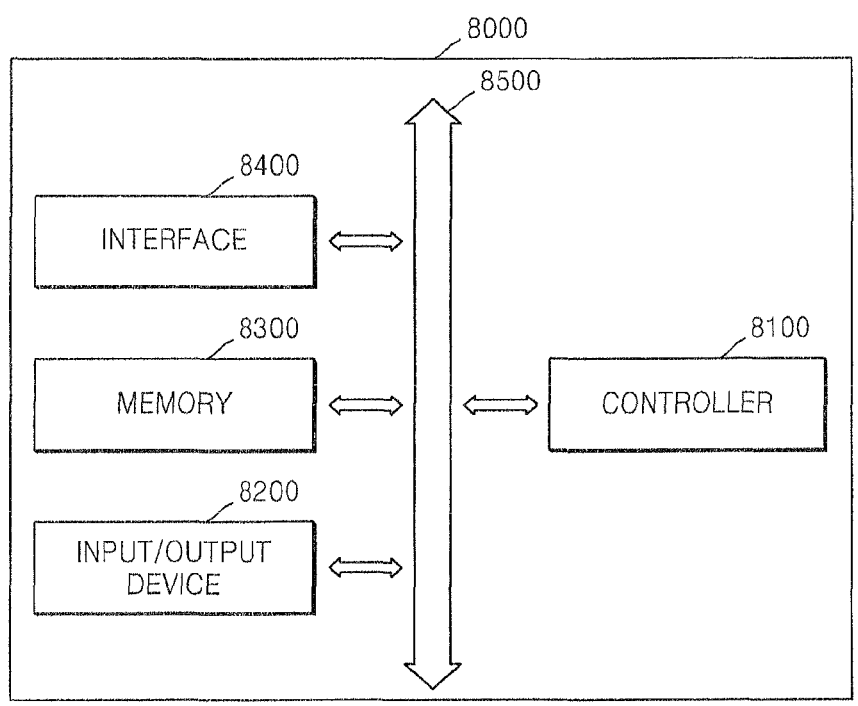
FIG. 28 is a schematic block diagram of a system including a chip-stacked semiconductor package according to an embodiment of the inventive concept.

FIG. 28 is a schematic block diagram of a system 8000 including a chip-stacked semiconductor package according to an embodiment of the inventive concept.

Referring to FIG. 28, the system 8000 may include a controller 8100, an input/output device 8200, a memory 8300, and an interface 8400. The system 8000 may be a mobile system or a system that transmits or receives data. The mobile system may be a personal digital assistant (PDA), a portable computer, a web tablet, a wireless phone, a mobile phone, a digital music player, or a memory card.

The controller 8100 executes a software program and controls the system 8000. The controller 8100 may be a microprocessor, a digital signal processor, a microcontroller, or the like. The input/output device 8200 may be used to input or output data of the system 8000.

The system 8000 is connected to an external apparatus, for example, a personal computer or a network, using the input/output device 8200, to send/receive data to/from the external apparatus. The input/output device 8200 may be a keypad, a keyboard, or a display. The memory 8300 may store codes and/or data for operating the controller 8100 and/or may store data processed by the controller 8100. The controller 8100 and the memory 8300 may include a chip-stacked semiconductor package according to an embodiment of the inventive concept. The interface 8400 may be a data transmission path between the system 8000 and an external apparatus. The controller 8100, the input/output device 8200, the memory 8300, and the interface 8400 may communicate with one another by a bus 8500.

For example, the system 8000 may be used for a mobile phone, an MP3 player, a navigation system, a portable multimedia player (PMP), a solid state disk (SSD), or a household appliance.

The foregoing description is illustrative of exemplary embodiments of the present inventive concept and is not to be construed as limiting thereof. Although exemplary embodiments have been described, those of ordinary skill in the art will readily appreciate that many modifications are possible in the exemplary embodiments without materially departing from the novel teachings and advantages of these exemplary embodiments. Accordingly, all such modifications are intended to be encompassed within the scope of the claims. Exemplary embodiments are defined by the following claims, with equivalents of the claims intended to be included therein.

What is claimed is:

1. A method of manufacturing a chip-stacked semiconductor package, the method comprising:
   providing a base wafer including a plurality of first chips each having a through-silicon via (TSV) and a first connection unit including a bump pad and a bump electrically connected to the through-silicon via (TSV);
   bonding the base wafer including the plurality of first chips to a supporting carrier and covering the first connection unit with the supporting carrier;
   providing a plurality of second chips; and
   forming stacked chips by bonding the plurality of second chips to the plurality of first chips.

2. The method of claim 1, further comprising, sealing the stacked chips with a sealing portion and separating the stacked chips from each other.

3. The method of claim 1, further comprising, forming a protection layer and a conductive pad connected to the TSV on the base wafer and bonding a non-conductive film (NCF) or an anisotropic conductive film (ACF) to the protection layer and the conductive pad, and the forming of the stacked chips comprises bonding the plurality of second chips to the plurality of first chips through the NCF or the ACF.

4. The method of claim 1, further comprising, filling a connection portion between the first chips and the second chips with an underfill.

5. The method of claim 1, wherein, when the plurality of second chips are bonded to the plurality of first chips, at least two second chips are stacked on one first chip to provide stacked chips each comprising at least three chips.

6. The method of claim 1, wherein the base wafer is prepared by a method comprising:
   providing a semiconductor substrate having a first surface and a second surface opposite the first surface;
   forming the TSV through the semiconductor substrate;
   exposing the TSV to the second surface; and
   forming a protection layer and a conductive pad connected to the TSV on the second surface,
   wherein, in the bonding of the base wafer, the first connection unit of the first chip faces the supporting carrier.

7. The method of claim 1, wherein the plurality of second chips each comprise a TSV.

8. The method of claim 1, wherein each of the plurality of second chips comprises a second connection unit electrically connected to an integrated circuit layer thereof,
   wherein, in the forming of the stacked chips, the second connection unit is electrically connected to the TSV.

9. The method of claim 2, further comprising, before the separating of the stacked chips, exposing upper surfaces of the second chips by grinding an upper portion of the sealing portion.

10. The method of claim 9, further comprising: after the exposing of the upper surfaces of the second chips,
    removing the supporting carrier;
    bonding a supporting substrate to the upper portion of the sealing portion; and
    performing an electrical die sort (EDS) test for the stacked chips.

11. The method of claim 9, further comprising: after the separating of the stacked chips,
    removing the supporting substrate; and
    mounting a separated stacked chip on a main chip.

12. The method of claim 11, wherein a second TSV and a third connection unit connected to the second TSV are formed in the main chip, and the main chip is mounted on a board substrate through the third connection unit.

13. A method of manufacturing a chip-stacked semiconductor package, the method comprising:
    preparing a base wafer including a plurality of first chips each having a first size defined by a first length and a first width, each of the plurality of first chips having a through-silicon via (TSV) and a first connection unit including a bump pad and a bump electrically connected to the through-silicon via (TSV);
    bonding the base wafer to a supporting carrier and covering the first connection unit with the supporting carrier; and
    forming stacked chips by bonding a plurality of second chips to the plurality of first chips, the plurality of second chips each having a second size defined by a second length and a second width, that are shorter and narrower than the first length and the first width, respectively.

14. The method of claim 13, further comprising, sealing the stacked chips with a sealing portion; and separating the stacked chips from each other by sawing the base wafer and the sealing portion exposing one or more sides of each of the first chips and one or more sides of each of the second chips.

15. The method of claim 14, wherein after separating the stacked chips from each other the sealing portion remains to cover a connection portion between the first chips and the second chips and the sides of the second chips.

16. The method of claim 14, wherein the base wafer and the sealing portion are sawed along lines so as to separate each of the first chips and exposing a sealing portion covering the sides of each of the second chips.

17. The method of claim 14, wherein the base wafer and the sealing portion are sawed along lines so as to separate each of the second chips and exposing the sides of the first chips and the second chips.

18. A method of manufacturing a chip-stacked semiconductor package, the method comprising:
   preparing a base wafer including a plurality of first chips each having a through silicon via (TSV) by a method including:
   providing a semiconductor substrate having a first surface and a second surface opposite the first surface;
   forming the TSV through the semiconductor substrate;
   exposing the TSV to the second surface; and
   forming a protection layer and a conductive pad connected to the TSV on the second surface,
   wherein, in the bonding of the base wafer, the first connection unit of the first chip faces the supporting carrier; and
   forming stacked chips by bonding one of a plurality of second chips to each of the plurality of first chips.

19. The method of claim 18, wherein the preparing of the base wafer further comprises:
   bonding a non-conductive film (NCF) or an anisotropic conductive film (ACF) to the protection layer and the conductive pad, wherein the forming of the stacked chips comprises bonding the plurality of second chips to the plurality of first chips through the NCF or the ACF.

20. The method of claim 18, wherein each of the plurality of second chips comprises a second connection unit electrically connected to an integrated circuit layer thereof; and wherein the second connection unit is electrically connected to the TSV.

* * * * *